United States Patent
Zenbutsu

(10) Patent No.: US 9,082,708 B2
(45) Date of Patent: Jul. 14, 2015

(54) SEMICONDUCTOR DEVICE

(75) Inventor: Shinichi Zenbutsu, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 75 days.

(21) Appl. No.: 13/496,547

(22) PCT Filed: Oct. 5, 2010

(86) PCT No.: PCT/JP2010/005950
§ 371 (c)(1),
(2), (4) Date: Mar. 16, 2012

(87) PCT Pub. No.: WO2011/043058
PCT Pub. Date: Apr. 14, 2011

(65) Prior Publication Data
US 2012/0175761 A1    Jul. 12, 2012

(30) Foreign Application Priority Data

Oct. 9, 2009 (JP) ................. P2009-234716
Aug. 31, 2010 (JP) ................. P2010-194020

(51) Int. Cl.
*C08L 63/00* (2006.01)
*H01L 23/29* (2006.01)
(Continued)

(52) U.S. Cl.
CPC ............. *H01L 23/293* (2013.01); *C08K 3/22* (2013.01); *C08K 3/36* (2013.01); *C08L 63/00* (2013.01);
(Continued)

(58) Field of Classification Search
USPC .................................................. 257/E23.033
See application file for complete search history.

(56) References Cited

U.S. PATENT DOCUMENTS 6,268,662 B1 * 7/2001 Test et al. ................ 257/784
6,376,101 B1 * 4/2002 Ota ........................... 428/620
(Continued)

FOREIGN PATENT DOCUMENTS

CN    1286906 C    11/2006
CN    100519651 C   7/2009
(Continued)

OTHER PUBLICATIONS
Machine translation of JP 2009-152561.*
(Continued)

*Primary Examiner* — Mark Kaucher
*Assistant Examiner* — Kregg Brooks
(74) *Attorney, Agent, or Firm* — Birch, Stewart, Kolasch & Birch, LLP

(57) ABSTRACT

Disclosed is a semiconductor device consisting of a lead frame or a circuit board, at least one semiconductor element which is stacked on or mounted in parallel on the lead frame or on the circuit board, a copper wire which electrically connects the lead frame or the circuit board to the semiconductor element, and an encapsulating material which encapsulates the semiconductor element and the copper wire, wherein the wire diameter of the copper wire is equal to or more than 18 μm and equal to or less than 23 μm, the encapsulating material is composed of a cured product of an epoxy resin composition, the epoxy resin composition contains an epoxy resin (A), a curing agent (B), a spherical silica (C), and a metal hydroxide and/or metal hydroxide solid solution (D), and the semiconductor device is obtained through a step of encapsulating by the epoxy resin composition and molding, and then segmenting the resultant into pieces.

8 Claims, 1 Drawing Sheet

(51) Int. Cl.
  H01L 23/495 (2006.01)
  C08K 3/22 (2006.01)
  C08K 3/36 (2006.01)
  H01L 23/00 (2006.01)
  H01L 23/31 (2006.01)
  C08K 7/26 (2006.01)

(52) U.S. Cl.
  CPC .............. *H01L 24/45* (2013.01); *H01L 24/97* (2013.01); *C08K 7/26* (2013.01); *H01L 23/3128* (2013.01); *H01L 24/48* (2013.01); *H01L 2224/32225* (2013.01); *H01L 2224/32245* (2013.01); *H01L 2224/45015* (2013.01); *H01L 2224/45144* (2013.01); *H01L 2224/45147* (2013.01); *H01L 2224/48091* (2013.01); *H01L 2224/48227* (2013.01); *H01L 2224/48247* (2013.01); *H01L 2224/73265* (2013.01); *H01L 2224/97* (2013.01); *H01L 2924/0102* (2013.01); *H01L 2924/0103* (2013.01); *H01L 2924/014* (2013.01); *H01L 2924/0104* (2013.01); *H01L 2924/01004* (2013.01); *H01L 2924/01005* (2013.01); *H01L 2924/01006* (2013.01); *H01L 2924/01011* (2013.01); *H01L 2924/01012* (2013.01); *H01L 2924/01013* (2013.01); *H01L 2924/01014* (2013.01); *H01L 2924/01015* (2013.01); *H01L 2924/01019* (2013.01); *H01L 2924/01023* (2013.01); *H01L 2924/01027* (2013.01); *H01L 2924/01028* (2013.01); *H01L 2924/01029* (2013.01); *H01L 2924/01033* (2013.01); *H01L 2924/01038* (2013.01); *H01L 2924/01043* (2013.01); *H01L 2924/01045* (2013.01); *H01L 2924/01056* (2013.01); *H01L 2924/01059* (2013.01); *H01L 2924/01072* (2013.01); *H01L 2924/01074* (2013.01); *H01L 2924/01077* (2013.01); *H01L 2924/01079* (2013.01); *H01L 2924/01082* (2013.01); *H01L 2924/01083* (2013.01); *H01L 2924/01105* (2013.01); *H01L 2924/10253* (2013.01); *H01L 2924/14* (2013.01); *H01L 2924/15311* (2013.01); *H01L 2924/20751* (2013.01); *H01L 2924/20752* (2013.01)

(56) References Cited

U.S. PATENT DOCUMENTS

| | | | |
|---|---|---|---|
| 6,555,602 B1 | 4/2003 | Harada et al. | |
| 6,888,230 B1 | 5/2005 | Ogino et al. | |
| 7,034,404 B1 | 4/2006 | Harada et al. | |
| 2004/0245320 A1* | 12/2004 | Fukagaya et al. | 228/110.1 |
| 2007/0251419 A1* | 11/2007 | Yamaguchi et al. | 106/287.13 |
| 2008/0064791 A1* | 3/2008 | Zenbutsu | 523/457 |
| 2008/0203568 A1 | 8/2008 | Tanaka et al. | |
| 2009/0054585 A1* | 2/2009 | Ogura et al. | 524/541 |
| 2009/0236700 A1* | 9/2009 | Moriya | 257/659 |
| 2009/0306272 A1* | 12/2009 | Nishi et al. | 524/493 |

FOREIGN PATENT DOCUMENTS

| | | |
|---|---|---|
| JP | 6-17554 A | 3/1994 |
| JP | 2000-309684 A | 11/2000 |
| JP | 2002-121260 A | 4/2002 |
| JP | 2003-292569 A | 10/2003 |
| JP | 2007-12776 A | 1/2007 |
| JP | 2007-23272 A | 2/2007 |
| JP | 2007161966 A * | 6/2007 |
| JP | 2009-152561 A | 7/2009 |
| JP | 2009-177104 A | 8/2009 |
| TW | 445528 B | 7/2001 |
| WO | WO 2007132770 A1 * | 11/2007 |

OTHER PUBLICATIONS

International Search Report, dated Nov. 2, 2010, issued in PCT/JP2010/005950.

Office Action issued Sep. 2, 2014, in Japanese Patent Application No. 2011-535278.

Office Action issued Nov. 18, 2014, in Taiwan Patent Application No. 099134346.

Office Action issued Apr. 30, 2014, in Chinese Patent Application No. 201080044844.6.

* cited by examiner

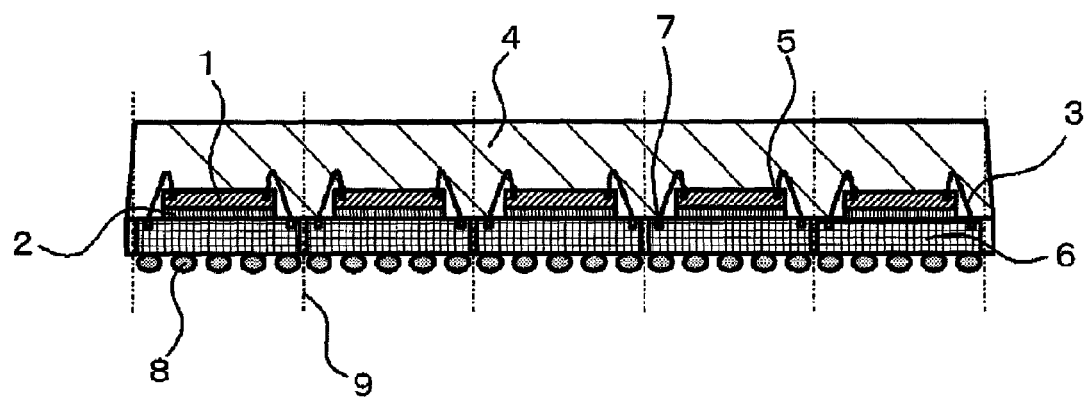

SEMICONDUCTOR DEVICE

TECHNICAL FIELD

The present invention relates to a semiconductor device. More particularly, the invention relates to a semiconductor device consisting of a lead frame having a die pad portion or a circuit board, at least one semiconductor element which is stacked on or mounted in parallel on the die pad portion of the lead frame or on the circuit board, a copper wire which electrically connects an electrical bonding portion provided on the die pad portion of the lead frame or the circuit board to an electrode pad provided on the semiconductor element, and an encapsulating material which encapsulates the semiconductor element and the copper wire.

BACKGROUND ART

Conventionally, electronic components such as diodes, transistors, integrated circuits and the like are largely encapsulated by a cured product of an epoxy resin composition. Especially for the integrated circuits, epoxy resin compositions excellent in heat resistance and moisture resistance are used, the epoxy resin compositions containing an epoxy resin, a phenol resin type curing agent and an inorganic filler such as fused silica, crystalline silica or the like. In recent years, however, in the market trends of reduction in size, lightness and high functionality of electronic equipments, higher integration of semiconductor elements is increasing every year, and surface mounting of semiconductor devices is accelerated, and thus the requirements for heat resistance and moisture resistance of the epoxy resin compositions used for encapsulation of semiconductor elements are becoming stricter.

On the other hand, because the demand for cost reduction on semiconductor devices is also strict and the cost of the conventional gold wire connection is high, connection with use of metals other than gold such as aluminum, a copper alloy and copper is also employed. However, metals other than gold are still insufficient in the high temperature storage life and high temperature operating life under the high temperature environment having a temperature exceeding 150 degrees centigrade, which are especially demanded in the automotive applications, and the electrical reliability such as the moisture resistance reliability under the high temperature and high humidity environment having a temperature exceeding 60 degrees centigrade and a relative humidity exceeding 60%, in addition to the cost. Furthermore, in connection with a non-gold wire, there are problems such as migration, corrosion and rise in electrical resistance, and thus satisfactory devices have not always been obtained.

Especially, in the semiconductor devices using copper wires, there is a problem that copper is easy to corrode in a moisture resistance reliability test and thus lacks in reliability. Therefore, although copper wires have been successfully used as wires with a relatively large wire diameter for discrete power devices, it is currently difficult to employ copper wires for ICs requiring wires with a wire diameter of equal to or less than 25 μm, especially for single-sided encapsulated packages whose wires are even affected by impurities attributable to a circuit board.

Patent Document 1 proposes an approach to improve the processability of copper wires themselves to increase the reliability of bonding portions. Meanwhile, Patent Document 2 proposes an approach to increase the connection reliability by coating each of the copper wires with a conductive metal to prevent oxidation of copper wires. However, corrosion and electrical reliability such as moisture resistance reliability of a package encapsulated by a resin, that is, a semiconductor device itself are not accounted for.

On the other hand, a MAP molding becomes a mainstream, in which, in order to achieve downsizing, weight reduction and sophistication of packages, and improve the productivity, many semiconductor elements are molded at one time, and the elements are cut into pieces after molding to obtain respective elements. In a MAP molded product, in order to mold a large thin molded product, low viscosity, strength capable of withstanding cutting during segmenting into pieces, non-breaking, non-cracking flexibility, further low wearability with respect to a cutting blade and the like have been demanded for an encapsulating resin. In order to improve the reliability of the aforementioned package, it is preferable that an inorganic filler is highly filled in an encapsulating resin to reduce the moisture absorption ratio. However, there is a problem that due to high filling of the inorganic filler, cutting resistance is high and the blade is thus easily worn to damage the package stuck in the blade during segmenting into pieces in some cases. Accordingly, easiness of segmenting into pieces and low wearability with respect to a blade have been demanded for an encapsulating resin.

RELATED DOCUMENT

Patent Document

Patent Document 1: Japanese Examined Patent Application Publication No. H06-017554
Patent Document 2: Japanese Unexamined Patent Application Publication No. 2007-12776

DISCLOSURE OF THE INVENTION

The present invention has been accomplished in view of the foregoing problems in the conventional arts. An object of the present invention is to provide a semiconductor device consisting of a lead frame or a circuit board, a semiconductor element, a copper wire and an encapsulating material, and obtained in a MAP method in which the semiconductor element and the copper wire are encapsulated with an epoxy resin composition for the encapsulating material and molded at one time, and then the molded product is segmented into pieces, wherein segmenting into pieces after encapsulating and molding is easy, a blade used for cutting is less worn, the copper wire which electrically connects an electrical bonding portion provided on the lead frame or the circuit board to an electrode pad provided on the semiconductor element is hardly corroded, and the semiconductor device is excellent in a balance among high temperature storage life, high temperature operating life and moisture resistance reliability.

According to the present invention, there is provided a semiconductor device consisting of a lead frame having a die pad portion or a circuit board provided with an electrical bonding portion, at least one semiconductor element having an electrode pad which is stacked on or mounted in parallel on the die pad portion of the lead frame or on the circuit board, a copper wire which electrically connects the electrical bonding portion provided on the lead frame or the circuit board to the electrode pad provided on the semiconductor element, and an encapsulating material which encapsulates the semiconductor element and the copper wire, wherein the wire diameter of the copper wire is equal to or more than 18 μm and equal to or less than 23 μm, the encapsulating material is composed of a cured product of an epoxy resin composition, the epoxy resin composition contains an epoxy resin (A), a curing agent (B), a spherical silica (C), and a metal hydroxide and/or metal hydroxide solid solution (D), and the semiconductor device is obtained through a step of encapsulating by the epoxy resin composition and molding, and then segmenting the resultant into pieces.

According to one embodiment of the present invention, in the aforementioned semiconductor device, the average particle diameter of the aforementioned metal hydroxide and/or metal hydroxide solid solution (D) is equal to or more than 1 μm and equal to or less than 10 μm.

According to one embodiment of the present invention, in the aforementioned semiconductor device, the content ratio of the aforementioned metal hydroxide and/or metal hydroxide solid solution (D) is equal to or more than 1% by mass and equal to or less than 10% by mass, based on the total mass of the aforementioned epoxy resin composition.

According to one embodiment of the present invention, in the aforementioned semiconductor device, the aforementioned metal hydroxide and/or metal hydroxide solid solution (D) contains crystallization water in an amount of equal to or more than 20% by mass.

According to one embodiment of the present invention, in the aforementioned semiconductor device, the aforementioned metal hydroxide and/or metal hydroxide solid solution (D) is aluminum hydroxide and/or magnesium hydroxide.

According to one embodiment of the present invention, in the aforementioned semiconductor device, the aforementioned epoxy resin composition further contains at least one kind of aluminum corrosion inhibitors selected from the group consisting of zirconium hydroxide, hydrotalcite and boehmite.

According to one embodiment of the present invention, in the aforementioned semiconductor device, the mode diameter of the aforementioned spherical silica (C) is equal to or less than 35 μm, and the content ratio of the particles having a diameter of equal to or more than 55 μm contained in the aforementioned spherical silica (C) is equal to or less than 0.1% by mass.

According to one embodiment of the present invention, in the aforementioned semiconductor device, the aforementioned epoxy resin contains at least one kind of epoxy resins selected from the group consisting of an epoxy resin represented by the general formula (1), an epoxy resin represented by the general formula (2), an epoxy resin represented by the general formula (3) and an epoxy resin represented by the general formula (4),

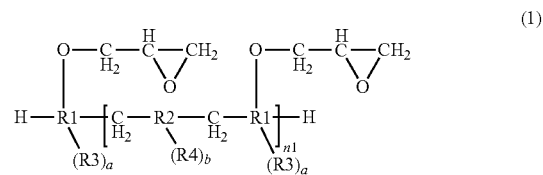

wherein, in the general formula (1), —R1- is a phenylene group or a naphthylene group; the bonding position of the glycidyl ether groups may be any one of α-position and β-position when —R1- is a naphthylene group; —R2- is a phenylene group, a biphenylene group or a naphthylene group; R3 and R4 are groups introduced to R1 and R2 respectively, are each a hydrocarbon group having 1 to 10 carbon atoms, and may be the same or different from each other; a is an integer of from 0 to 5; b is an integer of from 0 to 8; and an average value of n1 is a positive number of equal to or more than 1 and equal to or less than 3,

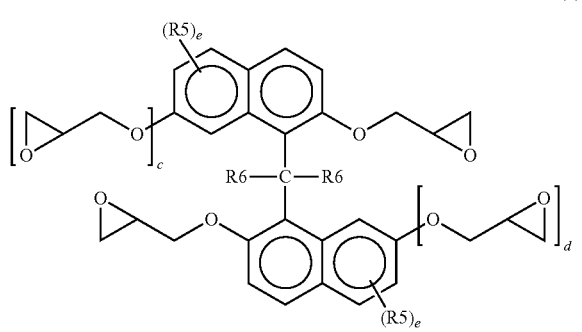

wherein, in the general formula (2), R5 is a hydrocarbon group having 1 to 4 carbon atoms, and may be the same or different from each other; R6 is a hydrogen atom or a hydrocarbon group having 1 to 4 carbon atoms, and may be the same or different from each other; c and d are each an integer of 0 or 1; and e is an integer of from 0 to 5,

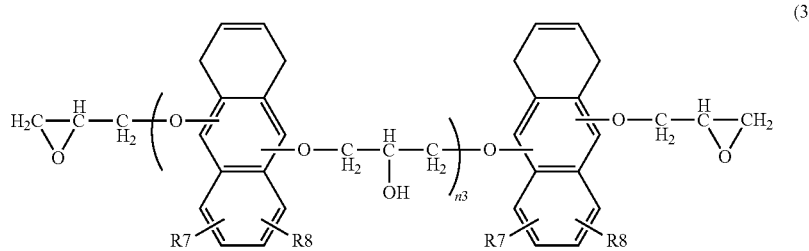

wherein, in the general formula (3), R7 and R8 are each a hydrogen atom or a methyl group; and n3 is an integer of from 0 to 5,

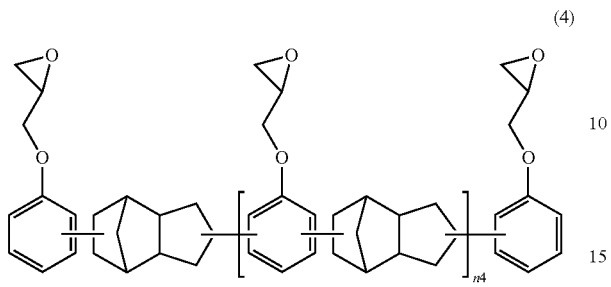

(4)

wherein, in the general formula (4), an average value of n4 is a positive number of equal to or more than 0 and equal to or less than 4.

According to one embodiment of the present invention, in the aforementioned semiconductor device, the aforementioned curing agent contains a phenol resin represented by the general formula (5),

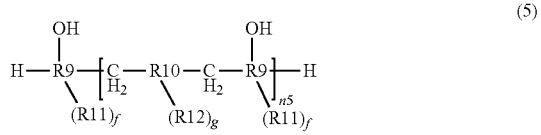

(5)

wherein, in the general formula (5), —R9- is a phenylene group or a naphthylene group; the binding position of the hydroxyl groups may be any one of α-position and β-position when —R9- is a naphthylene group; —R10- is a phenylene group, a biphenylene group or a naphthylene group; R11 and R12 are groups introduced to R9 and R10 respectively, are each a hydrocarbon group having 1 to 10 carbon atoms, and may be the same or different from each other; f is an integer of from 0 to 5; g is an integer of from 0 to 8; and an average value of n5 is a positive number of equal to or more than 1 and equal to or less than 3.

According to one embodiment of the present invention, in the aforementioned semiconductor device, the aforementioned curing agent contains a phenol resin represented by the general formula (6).

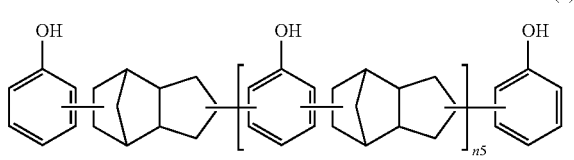

(6)

wherein, in the general formula (6), an average value of n6 is a positive number of equal to or more than 0 and equal to or less than 4.

According to the present invention, it is possible to obtain a semiconductor device consisting of a lead frame or a circuit board, a semiconductor element, a copper wire and an encapsulating material, and obtained in a MAP method in which the semiconductor element and the copper wire are encapsulated with an epoxy resin composition for the encapsulating material and molded at one time, and then the molded product is segmented into pieces, wherein segmenting into pieces after encapsulating and molding is easy, a cutting blade is less worn, and the copper wire which electrically connects an electrical bonding portion provided on the lead frame or the circuit board to an electrode pad provided on the semiconductor element is hardly corroded, and the semiconductor device is excellent in a balance among high temperature storage life, high temperature operating life and moisture resistance reliability.

BRIEF DESCRIPTION OF THE DRAWING

FIG. 1 is a cross-sectional view of the semiconductor device according to one embodiment of the present invention.

DESCRIPTION OF EMBODIMENTS

Hereinafter, the semiconductor device of the present invention will be described in detail.

The semiconductor device of the present invention consisting of a lead frame or a circuit board, a semiconductor element, a copper wire and an encapsulating material is a semiconductor device obtained in a MAP method in which the semiconductor element and the copper wire are encapsulated with an epoxy resin composition for an encapsulating material and molded at one time, and then the molded product is segmented into pieces.

FIG. 1 is a schematic cross-sectional view of one example of the semiconductor device of the present invention after encapsulating and molding (before segmenting into pieces) at one time, that is, a semiconductor device (MAP type BGA) to be segmented into pieces after encapsulating and molding a plurality of semiconductor elements mounted in parallel on a circuit board at one time. A plurality of semiconductor elements 1 are fixed in parallel on a circuit board 6 through a cured die bond material 2. An electrode pad 5 provided on the semiconductor element 1 and an electrode pad 7 provided on the circuit board 6 are electrically connected by means of a copper wire 3. Solder balls 8 are formed on a surface of the circuit board 6 opposite to a surface on which the semiconductor element 1 is mounted, and the solder balls 8 are electrically connected to the electrode pad 7 provided on the circuit board 6 inside the circuit board 6. An encapsulating material 4 is formed, for example, by a cured product of the aforementioned epoxy resin composition, and only one side of the circuit board 6 on which a plurality of semiconductor elements 1 are mounted is encapsulated by the encapsulating material 4 and molded at one time. Incidentally, the semiconductor elements are diced along a dicing line 9, thus segmenting into pieces. FIG. 1 illustrates one of semiconductor elements 1 mounted on the circuit board 6 in the semiconductor device after segmenting into pieces, but two or more semiconductor elements may be stacked or mounted in parallel.

Accordingly, the semiconductor device of the present invention obtained by the aforementioned segmentation process is composed of a lead frame having a die pad portion or a circuit board 6 provided with an electrode pad 7 as an electrical bonding portion, at least one semiconductor element 1 having an electrode pad 5 which is stacked on or mounted in parallel on the die pad portion of the lead frame or on the circuit board 6, a copper wire 3 which electrically connects the electrode pad 7 provided on the lead frame or the circuit board 6 to the electrode pad 5 provided on the semiconductor element 1, and an encapsulating material 4 which encapsulates the semiconductor element 1 and the copper wire 3.

In the aforementioned semiconductor device, the wire diameter of the copper wire is equal to or more than 18 μm and equal to or less than 23 μm, the encapsulating material is composed of a cured product of an epoxy resin composition, and the epoxy resin composition contains an epoxy resin (A), a curing agent (B), a spherical silica (C), and a metal hydroxide and/or metal hydroxide solid solution (D). Furthermore, the aforementioned semiconductor device is obtained through a step of encapsulating by the epoxy resin composition and molding, and then segmenting the resultant into pieces. By such a configuration of the semiconductor device of the present invention, segmenting into pieces after encapsulating and molding is easy, a cutting blade is less worn, a copper wire which electrically connects the electrical bonding portion provided on the lead frame or the circuit board to the electrode pad provided on the semiconductor element is hardly corroded, and a balance among high temperature storage life, high temperature operating life and moisture resistance reliability is excellent. Hereinafter, respective configurations will be described in detail.

First, the copper wire used for the semiconductor device of the present invention will be described. For a semiconductor device consisting of a lead frame having a die pad portion or a circuit board, at least one semiconductor element which is stacked on or mounted in parallel on the die pad portion of the lead frame or the circuit board, a wire which electrically connects an electrical bonding portion provided on the lead frame or the circuit board to an electrode pad provided on the semiconductor element, and an encapsulating material which encapsulates the semiconductor element and the wire, a narrow pad pitch and a small wire diameter are required in order to improve an integration degree. Specifically, a required wire diameter is equal to or less than 23 μm and further preferably equal to or less than 20 μm. When a copper wire is used as the wire, also contemplated is a method in which a bonding area is increased by increasing the wire diameter, for the purpose of enhancing the connection reliability attributable to the processability of the copper wire itself, whereby the degradation of the moisture resistance reliability attributable to insufficient bonding is suppressed. However, the above-described approach of increasing the wire diameter cannot improve the integration degree and cannot provide a satisfactory single-sided encapsulated semiconductor device. Furthermore, in the wire diameter of less than 18 μm, hardness of the copper wire itself cannot be fully exhibited and it is difficult to assemble the wire itself due to wire sweep.

The copper wire used for the semiconductor device of the present invention is equal to or less than 23 μm, preferably equal to or less than 20 μm and further preferably equal to or more than 18 μm. This range allows the ball configuration of each end of the copper wire to be stable and the connection reliability of a bonding portion to be improved. Furthermore, wire sweep can be prevented by hardness of the copper wire itself.

The copper wire used for the semiconductor device of the present invention is not particularly limited, and the copper purity is preferably equal to or more than 99.99% by mass and more preferably equal to or more than 99.999% by mass. In general, addition of various elements (dopants) to the copper allows the ball configuration of each end of the copper wire to be stable during bonding. When dopants are added in a large amount of more than 0.01% by mass, the ball portion is hardened during wire bonding and the electrode pad of the semiconductor element is damaged, causing defects such as degradation of the moisture resistance reliability, decrease in the high temperature storage life, and rise in electrical resistance, which are attributable to insufficient bonding. On the other hand, when the copper wire has a copper purity of equal to or more than 99.99% by mass, the ball portion has sufficient flexibility, so that there is less possibility that the pad is damaged during bonding. Incidentally, for the copper wire used for the semiconductor device of the present invention, the doping of 0.001 to 0.003% by mass of Ba, Ca, Sr, Be, Al, or a rare earth metal into the copper which is in the core wire allows to further improve the ball configuration and bonding strength.

The copper wire used for the semiconductor device of the present invention can be obtained by casting a copper alloy in a melting furnace, milling an ingot thereof using a roll, wire-drawing the resultant using a die, and performing post-heat treatment in which the wire is heated with continuous sweep.

Next, the encapsulating material used for the semiconductor device of the present invention will be described. The encapsulating material used for the semiconductor device of the present invention is composed of a cured product of the epoxy resin composition containing an epoxy resin (A), a curing agent (B), a spherical silica (C), and a metal hydroxide and/or metal hydroxide solid solution (D).

There is the risk of a problem of corrosion of the electrical bonding portion in the semiconductor device using the copper wire under the high temperature and high humidity environment. Thus, it is preferable that ionic impurity such as sodium or chlorine contained in the semiconductor encapsulating material is reduced for the purpose of improving the moisture resistance reliability. Hereinafter, respective components of the epoxy resin composition constituting the encapsulating material used for the semiconductor device of the present invention will be described.

The epoxy resin composition for an encapsulating material used for the semiconductor device of the present invention contains an epoxy resin (A). In the present invention, the epoxy resin (A) refers to monomers, oligomers and polymers having two or more epoxy groups in one molecule. The molecular weight and molecular structure thereof are not particularly limited. Examples of the epoxy resin (A) include crystalline epoxy resins such as a biphenyl type epoxy resin, a bisphenol type epoxy resin, a stilbene type epoxy resin and the like; novolac type epoxy resins such as a phenol novolac type epoxy resin, a cresol novolac type epoxy resin and the like; polyfunctional epoxy resins such as a triphenol methane type epoxy resin, an alkyl modified triphenol methane type epoxy resin and the like; aralkyl type epoxy resins such as a phenol aralkyl type epoxy resin having a phenylene skeleton, a phenol aralkyl type epoxy resin having a biphenylene skeleton and the like; dihydroanthracenediol type epoxy resins; naphthol type epoxy resins such as an epoxy resin obtained by glycidyl etherification of dimers of dihydroxynaphthalene and the like; triazine nucleus-containing epoxy resins such as triglycidyl isocyanurate, monoallyl diglycidyl isocyanurate and the like; and bridged cyclic hydrocarbon compound-modified phenol type epoxy resins such as a dicyclopentadiene-modified phenol type epoxy resin and the like. These may be used singly or may be used in combination of two or more kinds. Meanwhile, the amount of ionic impurity such as sodium ion or chlorine ion contained in these epoxy resins is respectively preferably equal to or less than 10 ppm and more preferably equal to or less than 5 ppm from the viewpoint of corrosion of the electrical bonding portion in the semiconductor device using the copper wire under the high temperature and high humidity environment.

Incidentally, the amount of the ionic impurity in the epoxy resins may be measured in the following manner. First, 5 g of the epoxy resin and 50 g of distilled water are sealed up in a pressure-resistant container made of Teflon (registered trademark), and the resulting material is subjected to treatment at 125 degrees centigrade and a relative humidity of 100% RH for 20 hours (pressure cooker treatment). Next, after cooling to room temperature, the extraction water is centrifuged and filtered through a 20 μm filter. The concentration of impurity ion is measured using a capillary electrophoresis apparatus (for example, CAPI-3300, commercially available from Otsuka Electronics Co., Ltd.). The concentration of impurity ion (unit: ppm) obtained herein is the numerical value measured for the impurity ion which is extracted from 5 g of the sample and diluted tenfold. Accordingly, the concentration is converted to the content of respective ions per unit mass of the resin composition in accordance with the following equation. The unit is ppm.

Impurity ion per unit mass of the sample=(concentration of impurity ion measured with a capillary electrophoresis apparatus)×50÷5

Incidentally, the content of ionic impurity contained in the curing agent to be described below can also be measured in the same manner.

In consideration of the reliability of the semiconductor device obtained through a step of encapsulating and molding at one time, and then segmenting into pieces, and a large thin product, in order to inhibit damage on a built-in semiconductor element due to warpage and deterioration of the reliability due to the stress applied on a bonding portion between a copper wire and an element, it is particularly preferable that the epoxy resin composition contains at least one epoxy resin selected from the group consisting of an epoxy resin represented by the general formula (1), an epoxy resin represented by the general formula (2), an epoxy resin represented by the general formula (3) and an epoxy resin represented by the general formula (4),

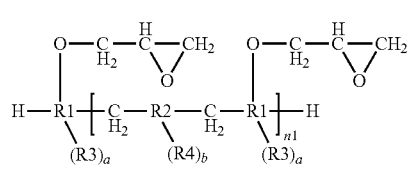

(1)

wherein, in the general formula (1), —R1- is a phenylene group or a naphthylene group; the bonding position of the glycidyl ether groups may be any one of α-position and β-position when —R1- is a naphthylene group; —R2- is a phenylene group, a biphenylene group or a naphthylene group; R3 and R4 are groups introduced to R1 and R2 respectively, are each a hydrocarbon group having 1 to 10 carbon atoms, and may be the same or different from each other; a is an integer of from 0 to 5; b is an integer of from 0 to 8; and an average value of n1 is a positive number of equal to or more than 1 and equal to or less than 3,

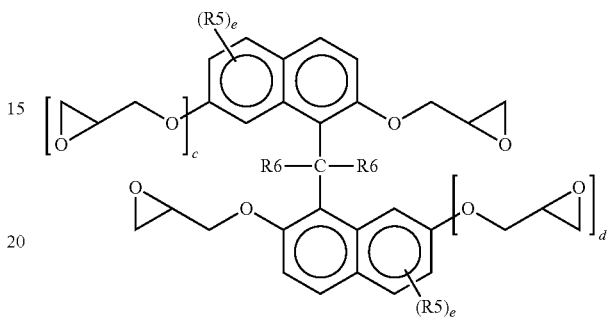

(2)

wherein, in the general formula (2), R5 is a hydrocarbon group having 1 to 4 carbon atoms, and may be the same or different from each other; R6 is a hydrogen atom or a hydrocarbon group having 1 to 4 carbon atoms, and may be the same or different from each other; c and d are each an integer of 0 or 1; and e is an integer of from 0 to 5,

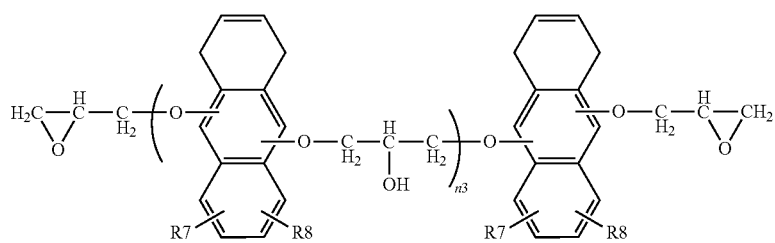

(3)

wherein, in the general formula (3), R7 and R8 are each a hydrogen atom or a methyl group; and n3 is an integer of from 0 to 5,

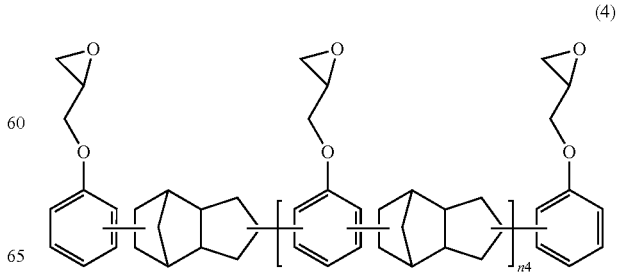

(4)

wherein, in the general formula (4), an average value of n4 is a positive number of equal to or more than 0 and equal to or less than 4.

The epoxy resins represented by the general formulae (1) and (4) have the feature that a molded product in which the elastic modulus during heating is low and the moisture absorption ratio is low is obtained. Thus, the stress applied on the semiconductor element bonding portion is reduced and further the effect of improving the moisture resistance reliability may be achieved.

The epoxy resin represented by the general formula (2) has a naphthalene skeleton in the molecules, thus have high bulkiness and high rigidity. Consequently, the cure shrinkage ratio of the cured product of the epoxy resin composition using the above epoxy resin is reduced and low warpage properties are excellent. Thus, the effect of reducing the stress applied on the semiconductor element bonding portion may be obtained.

Meanwhile, the epoxy resin represented by the general formula (3) has a bulky group and high rigidity. Consequently, the cure shrinkage ratio of the cured product of the epoxy resin composition using the above epoxy resin is reduced and low warpage properties are excellent. Thus, the effect of reducing the stress applied on the semiconductor element bonding portion may be obtained.

The mixing ratio of the epoxy resins represented by the general formulae (1), (2), (3) and (4) is preferably equal to or more than 20% by mass, more preferably equal to or more than 30% by mass and particularly preferably equal to or more than 50% by mass, based on the total amount of the epoxy resin (A). When the mixing ratio is within the above range, the stress applied on the semiconductor element bonding portion may be effectively reduced.

The lower limit of the mixing ratio of the total amount of the epoxy resin (A) is not particularly limited, but it is preferably equal to or more than 3% by mass and more preferably equal to or more than 5% by mass, based on the total amount of the epoxy resin composition. When the mixing ratio of the total amount of the epoxy resin (A) is within the above range, there is less possibility of causing wire sweep or breaking of wires due to an increase in viscosity. On the other hand, the upper limit of the mixing ratio of the total amount of the epoxy resin (A) is not particularly limited, but it is preferably equal to or less than 15% by mass and more preferably equal to or less than 13% by mass, based on the total amount of the epoxy resin composition. When the upper limit of the mixing ratio of the total epoxy resin is within the above range, there is less possibility of causing deterioration of the moisture resistance reliability due to an increase in the moisture absorption ratio.

The epoxy resin composition for an encapsulating material used for the semiconductor device of the present invention contains a curing agent (B). The curing agent (B) may be classified into three types such as a polyaddition type curing agent, a catalyst type curing agent and a condensation type curing agent.

Examples of the polyaddition type curing agent include aliphatic polyamines such as diethylenetriamine (DETA), triethylenetetramine (TETA), metaxylylenediamine (MXDA) and the like; aromatic polyamines such as diaminodiphenyl methane (DDM), m-phenylenediamine (MPDA), diaminodiphenylsulfone (DDS) and the like; polyamine compounds containing dicyandiamide (DICY), organic acid dihydrazide and the like; acid anhydrides containing alicyclic acid anhydrides such as hexahydrophthalic anhydride (HHPA), methyltetrahydrophthalic anhydride (MTHPA) and the like, and aromatic acid anhydrides such as trimellitic anhydride (TMA), pyromellitic dianhydride (PMDA), benzophenone-tetracarboxylic acid (BTDA) and the like; polyphenol compounds such as a novolac type phenol resin, a phenol polymer and the like; polymercaptan compounds such as polysulfide, thioester, thioether and the like; isocyanate compounds such as isocyanate prepolymer, blocked isocyanate and the like; and organic acids such as a polyester resin containing a carboxylic acid and the like.

Examples of the catalyst type curing agent include tertiary amine compounds such as benzyldimethylamine (BDMA), 2,4,6-tris(dimethylaminomethyl)phenol (DMP-30) and the like; imidazole compounds such as 2-methylimidazole, 2-ethyl-4-methylimidazole (EMI24) and the like; and Lewis acids such as BF3 complexes and the like.

Examples of the condensation type curing agent include phenol resin type curing agents such as a novolac type phenol resin, a resol type phenol resin and the like; urea resins such as urea resins containing a methylol group; and melamine resins such as melamine resins containing a methylol group.

Among these, preferably used are phenol resin type curing agents from the viewpoint of a balance among flame resistance, moisture resistance, electric characteristics, curability, storage stability and the like. The phenol resin type curing agent refers to monomers, oligomers and polymers having two or more phenolic hydroxyl groups in one molecule. The molecular weight and molecular structure thereof are not particularly limited. Examples of the phenol resin type curing agent include novolac type resins such as a phenol novolac resin, a cresol novolac resin and the like; polyfunctional phenol resins such as a triphenol methane type phenol resin and the like; modified phenol resins such as a terpene-modified phenol resin, a dicyclopentadiene-modified phenol resin and the like; aralkyl type resins such as a phenol aralkyl resin having a phenylene skeleton and/or a biphenylene skeleton, a naphthol aralkyl resin having a phenylene skeleton and/or a biphenylene skeleton and the like; and bisphenol compounds such as bisphenol A, bisphenol F and the like. These may be used singly or may be used in combination of two or more kinds. Furthermore, the amount of the ionic impurity such as sodium ion or chlorine ion contained in these phenol resin type curing agents is preferably equal to or less than 10 ppm and more preferably equal to or less than 5 ppm from the viewpoint of corrosion of the electrical bonding portion in the semiconductor device using a copper wire under the high temperature and high humidity environment.

In consideration of the reliability of the semiconductor device obtained through a step of encapsulating and molding at one time and then segmenting into pieces, and a large thin product, in order to inhibit damage on a built-in semiconductor element due to warpage and deterioration of the reliability due to the stress applied on a bonding portion between a copper wire and an element, it is particularly preferable that the epoxy resin composition contains at least one curing agent selected from the group consisting of phenol resins represented by the general formula (5) and/or at least one curing agent selected from the group consisting of phenol resins represented by the general formula (6),

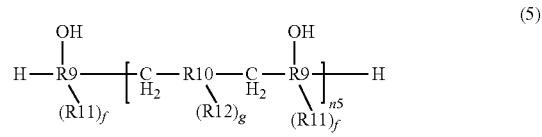

(5)

wherein, in the general formula (5), —R9- is a phenylene group or a naphthylene group; the binding position of the hydroxyl groups may be any one of α-position and β-position when —R9- is a naphthylene group; —R10- is a phenylene group, a biphenylene group or a naphthylene group; R11 and R12 are groups introduced to 9 and R10 respectively, are each a hydrocarbon group having 1 to 10 carbon atoms, and may be the same or different from each other; f is an integer of from 0 to 5; g is an integer of from 0 to 8; and an average value of n5 is a positive number of equal to or more than 1 and equal to or less than 3,

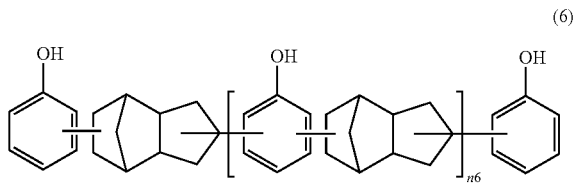

(6)

wherein, in the general formula (6), an average value of n6 is a positive number of equal to or more than 0 and equal to or less than 4.

Among phenol resins represented by the general formula (5), preferably used is a phenol resin in which —R9- and/or R10- is a naphthylene group, thus have high rigidity. Consequently, the cure shrinkage ratio of the cured product of the epoxy resin composition using the above phenol resin is reduced and low warpage properties are excellent. Thus, the stress applied on the semiconductor element bonding portion may be reduced.

Meanwhile, when —R9- and/or —R10- is a phenylene group or a biphenylene group, the distance between the crosslinks thereof is long. Consequently, the cured product of the epoxy resin composition using the above phenol resin has a low moisture absorption ratio and exhibits reduction of elastic modulus at high temperature. Thus, the stress applied on the semiconductor element bonding portion is reduced and further the moisture resistance reliability may be improved.

Examples of the phenol resin represented by the general formula (5) include a phenol aralkyl resin having a phenylene skeleton, a phenol aralkyl resin having a biphenylene skeleton, a naphthol aralkyl resin having a phenylene skeleton and the like, but the phenol resin is not particularly limited as long as it has a structure of the general formula (5). These may be used singly or may be used in combination of two or more kinds.

The mixing ratio of the phenol resin represented by the general formula (5) is preferably equal to or more than 20% by mass, more preferably equal to or more than 30% by mass and particularly preferably equal to or more than 50% by mass, based on the total amount of the curing agent (B). When the mixing ratio is within the above range, the effect of reducing the stress applied on the semiconductor element bonding portion in the semiconductor device may be effectively achieved.

The phenol resin represented by the general formula (6) has the feature that the elastic modulus during heating is low and a molded product having a low moisture absorption ratio is obtained. Thus, the stress applied on the semiconductor element bonding portion is reduced and further the effect of improving the moisture resistance reliability may be achieved.

The lower limit of the mixing ratio of the total amount of the curing agent (B) is not particularly limited, but it is preferably equal to or more than 0.8% by mass and more preferably equal to or more than 1.5% by mass, based on the total amount of the epoxy resin composition. When the lower limit of the mixing ratio is within the above range, sufficient fluidity may be achieved. Meanwhile, the upper limit of the mixing ratio of the total amount of the curing agent (B) is not particularly limited, but it is preferably equal to or less than 10% by mass and more preferably equal to or less than 8% by mass, based on the total amount of the epoxy resin composition. When the upper limit of the mixing ratio is within the above range, there is less possibility of causing deterioration of the moisture resistance reliability due to an increase in the moisture absorption ratio.

Moreover, when the phenol resin type curing agent is used as the curing agent (B), the mixing ratio of the epoxy resin to the phenol resin type curing agent is preferably an equivalent ratio of the number of the epoxy groups (EP) of the overall epoxy resin to the number of the phenolic hydroxyl groups (OH) of the overall phenol resin type curing agent, that is, (EP)/(OH), of equal to or more than 0.8 and equal to or less than 1.3. When the equivalent ratio is within the above range, there is less possibility that decrease in curability of the epoxy resin composition for encapsulating a semiconductor or degradation of physical properties of the cured product of the resin and the like is caused.

In the epoxy resin composition for an encapsulating material used for the semiconductor device of the present invention, the spherical silica (C) and the metal hydroxide and/or metal hydroxide solid solution (D) may be used as the filler. In the present invention, as the spherical silica (C), the mode diameter is preferably equal to or less than 35 μm and more preferably equal to or less than 30 μm. When the spherical silica having a mode diameter within the above range is used, the present invention can be applied to a semiconductor device having a narrow wire pitch as well. Furthermore, as the spherical silica (C), the content of coarse particles having a diameter of equal to or more than 55 μm is preferably equal to or less than 0.1% by mass and more preferably equal to or less than 0.05% by mass. When the content of the coarse particles is within the above range, the defect that the coarse particles are sandwiched between the wires and push down the wires, that is, wire sweep, may be prevented. Such a filler having a predetermined particle size distribution can be the commercial filler as it is or can be obtained by mixing the plural kinds of the fillers or sieving the filler. Furthermore, the mode diameter of the fused spherical silica used for the present invention may be measured using a commercial laser particle size distribution analyzer (for example, SALD-7000, commercially available from Shimadzu Corporation, or the like).

For the spherical silica (C) used in the present invention, an increase in the melt viscosity of the epoxy resin composition is suppressed. Furthermore, the content of the spherical silica (C) in the epoxy resin composition may be increased by adjusting the particle size distribution of the spherical silica (C) to be broader.

The content ratio of the spherical silica (C) is not particularly limited, but it is preferably equal to or more than 82% by mass and more preferably equal to or more than 86% by mass, based on the total amount of the epoxy resin composition, in consideration of warpage of the semiconductor device. When it does not fall below the above lower limit, low moisture absorption and low thermal expansion are achieved, in addition to the effect of reduced warpage, so that there is less possibility that the moisture resistance reliability is insufficient. On the other hand, in consideration of moldability, the upper limit of the content ratio of the spherical silica is preferably equal to or less than 92% by mass and more preferably equal to or less than 89% by mass, based on the total amount of the epoxy resin composition. When it does not exceed the above upper limit, there is less possibility that the fluidity is lowered to cause insufficient filling or the like during molding, or defects such as wire sweep and the like are caused in the semiconductor device due to high viscosity.

For the metal hydroxide and/or metal hydroxide solid solution (D) used in the present invention, crystallization water is discharged during segmenting the semiconductor device into pieces and generation of heat due to wearing of a blade is suppressed, whereby cutting resistance is reduced and the effect of suppressing wearing of a blade is exhibited. Furthermore, the metal hydroxide and/or metal hydroxide solid solution (D) exhibits a basic property, so that an acid gas causing corrosion of the electrical bonding portion under the high temperature is neutralized and the effect of improving high temperature storage life is exhibited. The average particle diameter of metal hydroxide and the average particle diameter of a solid in the metal hydroxide solid solution are preferably equal to or more than 1 μm and equal to or less than 10 μm, and more preferably equal to or more than 2 μm and equal to or less than 5 μm. When it is less than the above lower limit, there is a possibility of causing wire sweep due to an increase in the material viscosity. When it exceeds the above upper limit, the metal hydroxide and/or metal hydroxide solid solution (D) is fallen out during cutting, whereby there is a possibility of generating nests on a cross-section of the molded product or causing cracking of the molded product due to fallen particles.

Both the content ratio of crystallization water in metal hydroxide and the content ratio of crystallization water in the metal hydroxide solid solution are preferably equal to or more than 20% by mass. When it is less than the above lower limit, suppression of generation of heat by discharge of crystallization water or the effect of decrease in cutting resistance is not fully exhibited; therefore, it is not preferable. On the other hand, the amount of the total metal hydroxide and/or metal hydroxide solid solution (D) component added is preferably equal to or more than 0.5% by mass and equal to or less than 10% by mass, and particularly preferably from 1 to 5% by mass, based on the total amount of the epoxy resin composition. When it is less than the above lower limit, suppression of generation of heat by discharge of crystallization water or the effect of decrease in cutting resistance is not expected. When it exceeds the above upper limit, the fluidity is extremely lowered or strength of the molded product is lowered, so that there is a problem of breaking or cracking during segmenting into pieces.

The component (D) used in the present invention is preferably composed of metal hydroxide containing crystallization water of equal to or more than 20% by mass and/or a metal hydroxide solid solution containing crystallization water of equal to or more than 20% by mass. Such metal hydroxide is not particularly limited, and examples include aluminum hydroxide, magnesium hydroxide and the like. Meanwhile, there may be used a high heat resistant type aluminum hydroxide with an increased temperature for initiating discharge of crystallization water by subjecting a part to boehmite conversion, refinement, or reduction of sodium ion. These may be used singly or may be used in combination of two or more kinds. Furthermore, there may be used a metal hydroxide solid solution in which some elements in crystals of metal hydroxide are substituted with other elements such as iron, nickel, titanium, zinc, silicon and the like to form a solid solution. These may be used singly or may be used in combination of two or more kinds.

In the epoxy resin composition for an encapsulating material used for the semiconductor device of the present invention, a filler other than the aforementioned components (C) and (D) may be used together. As the other fillers to be used together, fillers used in the epoxy resin composition for an encapsulating material in general may be cited. Examples include crushed silica, alumina, titanium white, silicon nitride and the like. These fillers may be used singly or may be used in combination of two or more kinds. Furthermore, these fillers may be surface-treated with a coupling agent. From the viewpoint of improvement of fluidity, the filler has as high sphericity as possible and has a broad particle size distribution.

The content ratio of the total fillers consisting of the components (C) and (D) and other fillers is not particularly limited, but it is preferably equal to or more than 80% by mass and more preferably equal to or more than 88% by mass, based on the total amount of the epoxy resin composition, from the viewpoints of warpage, moisture resistance reliability and the like. On the other hand, it is preferably equal to or less than 92% by mass and more preferably equal to or less than 90% by mass, based on the total amount of the epoxy resin composition from the viewpoints of the fluidity and the like.

The epoxy resin composition for an encapsulating material used for the semiconductor device of the present invention may further contain a curing accelerator. The curing accelerator may be any of those accelerating the crosslinking reaction of the epoxy group of the epoxy resin with the curing agent (for example, the phenolic hydroxyl group of the phenol resin type curing agent), and those generally used for the epoxy resin composition for an encapsulating material may be used. Examples thereof include diazabicycloalkenes such as 1,8-diazabicyclo(5,4,0)undecene-7 and derivatives thereof; organic phosphines such as triphenylphosphine, methyldiphenylphosphine and the like; imidazole compounds such as 2-methylimidazole and the like; tetra-substituted phosphonium tetra-substituted borates such as tetraphenylphosphonium tetraphenylborate and the like; and the adducts of a phosphine compound with a quinone compound and the like. These may be used singly or may be used in combination of two or more kinds.

The lower limit of the mixing ratio of the curing accelerator is not particularly limited, but it is preferably equal to or more than 0.05% by mass and more preferably equal to or more than 0.1% by mass, based on the total amount of the epoxy resin composition. When the lower limit of the mixing ratio of the curing accelerator is within the above range, there is less possibility that decrease in curability is caused. On the other hand, the upper limit of the mixing ratio of the curing accelerator is not particularly limited, but it is preferably equal to or less than 1% by mass and more preferably equal to or less than 0.5% by mass, based on the total amount of the epoxy resin composition. When the upper limit of the mixing ratio of the curing accelerator is within the above range, there is less possibility that reduction of fluidity is caused.

Among the curing accelerators, more preferably used are the adducts of a phosphine compound with a quinone compound from the viewpoint of the fluidity. Examples of the phosphine compound used for the adduct of a phosphine compound with a quinone compound include triphenylphosphine, tri-p-tolylphosphine, diphenylcyclohexylphosphine, tricyclohexylphosphine, tributyl phosphine, and the like. Examples of the quinone compound used for the adduct of a phosphine compound with a quinone compound include 1,4-benzoquinone, methyl-1,4-benzoquinone, methoxy-1,4-benzoquinone, phenyl-1,4-benzoquinone, 1,4-naphthoquinone, and the like. Among these adducts of a phosphine compound with a quinone compound, more preferably used is the adduct of the triphenylphosphine with the 1,4-benzoquinone. The method for producing the adduct of a phosphine compound with a quinone compound is not particularly limited, but the adduct can be produced, for example, by addition reaction between a phosphine compound and a quinone compound, which are used as raw materials, in an organic solvent which dissolves both, and by isolation of the resultant.

In the epoxy resin composition for an encapsulating material used for the semiconductor device of the present invention, there may be properly added, as necessary, various additives including aluminum corrosion inhibitors such as zirconium hydroxide; inorganic ion exchangers such as bismuth oxide hydrate, magnesium oxide hydrate, aluminum oxide hydrate and the like; coupling agents such as γ-glycidoxypropyltrimethoxysilane, 3-mercaptopropyltrimethoxysilane, 3-aminopropyltrimethoxysilane and the like; coloring agents such as carbon black, colcothar and the like; low stress components such as silicone rubber and the like; natural waxes such as carnauba wax; synthetic waxes; higher fatty acids such as zinc stearate, and metal salts thereof; and mold release agents such as paraffin; antioxidants and the like.

In particular, as the aluminum corrosion inhibitor, preferably used is a basic aluminum corrosion inhibitor capable of neutralizing an acid gas that is a gas corroding a bonding portion between a copper wire and an aluminum pad at high temperature. The aforementioned component (D) such as aluminum hydroxide or magnesium hydroxide is applicable, and in addition thereto, examples include zirconium hydroxide, hydrotalcite, boehmite and the like. With the addition of these aluminum corrosion inhibitors, it is possible to further improve high temperature storage life of a semiconductor device having a copper wire.

In the epoxy resin composition for an encapsulating material used for the semiconductor device of the present invention, the mixing amount of the aforementioned aluminum corrosion inhibitor is not particularly limited, but it is preferably from 0.1 to 1% by weight and further preferably from 0.1 to 0.5% by weight, based on the total amount of the epoxy resin composition.

When the mixing amount of the aluminum corrosion inhibitor is equal to or more than the above lower limit, high temperature storage life and moisture resistance may be improved. Meanwhile, when it is equal to or less than the above upper limit, high temperature storage life and moisture resistance may be improved without increasing wire sweep, warpage after PMC and variation of warpage during processing.

The average particle diameter of the aforementioned aluminum corrosion inhibitor is preferably equal to or more than 1 μm and equal to or less than 10 μm, and further preferably equal to or more than 2 μm and equal to or less than 5 μm.

When the average particle diameter of the aluminum corrosion inhibitor is equal to or more than the above lower limit, high temperature storage life and moisture resistance may be improved without increasing warpage after PMC and variation of warpage during processing. Meanwhile, when it is equal to or less than the above upper limit, high temperature storage life and moisture resistance may be improved without increasing wire sweep.

The epoxy resin composition for an encapsulating material used for the semiconductor device of the present invention contains aluminum hydroxide and/or magnesium hydroxide as the metal hydroxide and/or metal hydroxide solid solution (D), along with the epoxy resin (A), the curing agent (B) and the spherical silica (C), and it is particularly preferable that it further contains at least one or more of aluminum corrosion inhibitors selected from the group consisting of zirconium hydroxide, hydrotalcite and boehmite.

Thus, cutting property, tool wearability, warpage after PMC and variation of warpage during processing are excellent, and high temperature storage life and moisture resistance are rapidly improved.

Furthermore, as necessary, the inorganic filler may be treated with an epoxy resin or a phenol resin in advance. Examples of such a treatment method include a method in which the inorganic filler is mixed with the epoxy resin or the phenol resin using a solvent and then the solvent is removed, a method in which the epoxy resin or the phenol resin is directly added to the inorganic filler and the mixing treatment is carried out using a mixer, and the like.

The epoxy resin composition for an encapsulating material used for the semiconductor device of the present invention can be produced by mixing each of the above-mentioned components at ordinary temperature using, for example, a mixer and the like, or after that by melt-kneading the resultant using a kneading machine such as a roll, a kneader, an extruder or the like, and grinding it after cooling, and in addition, appropriately adjusting degree of dispersion, fluidity and the like, as necessary.

Next, the semiconductor device of the present invention will be described. The semiconductor device of the present invention is a semiconductor device consisting of a lead frame having a die pad portion or a circuit board, at least one semiconductor element which is stacked on or mounted in parallel on the die pad portion of the lead frame or on the circuit board, a copper wire which electrically connects an electrical bonding portion provided on the lead frame or the circuit board to an electrode pad provided on the semiconductor element, and an encapsulating material which encapsulates the semiconductor element and the copper wire. Furthermore, the semiconductor device of the present invention is obtained through a step of encapsulating and molding a plurality of electronic components such as semiconductor elements or the like at one time using an epoxy resin composition for an encapsulating material in accordance with a conventionally known molding method such as transfer molding, compression molding or injection molding, and then segmenting the resultant into pieces.

The lead frame or the circuit board used in the present invention is not particularly limited. Examples thereof include lead frames or the circuit boards used in conventionally known semiconductor devices, such as a tape carrier package (TCP), a ball grid array (BGA), a chip size package (CSP), a quad flat non-leaded package (QFN), a lead frame-BGA (LF-BGA), a mold array package type BGA (MAP-BGA) and the like. The electrical bonding portion means a terminal for bonding the wire onto the lead frame or the circuit board, for example, a wire bonding portion on the lead frame, an electrode pad on the circuit board, and the like.

Examples of the shape of the semiconductor device of the present invention include a MAP type ball grid array (BGA), a MAP type chip size package (CSP), a MAP type quad flat non-leaded package (QFN) and the like, which are obtained through a step of encapsulating by an epoxy resin composition and molding, and then segmenting the resultant into pieces. The semiconductor device encapsulated by the aforementioned molding method such as transfer molding or the like may be mounted as it is on an electronic equipment and the like, or may be mounted on an electronic equipment through a dicing step after completely curing the encapsulating material by heating it at a temperature of about 80 to 200 degrees centigrade over about 10 minutes to 10 hours. Incidentally, the dicing step may be carried out after encapsulating and molding at one time or before completely curing by a heat treatment.

EXAMPLES

Hereinafter, the present invention will be described with reference to Examples. However, the present invention is not restricted to these Examples. The mixing ratio means part by mass. Respective components of the epoxy resin composition for an encapsulating material used in Examples and Comparative Examples will be described below.

Respective Components of Epoxy Resin Composition for Encapsulating Material

Epoxy Resin

E-1: Bisphenol A type epoxy resin (YL-6810, commercially available from Mitsubishi Chemical Corporation, melting point: 45 degrees centigrade, epoxy equivalent: 172 g/eq).

E-2: Phenol aralkyl type epoxy resin having a biphenylene skeleton (an epoxy resin in which, in the general formula (1), —R1- is a phenylene group, —R2- is a biphenylene group, a is 0 and b is 0, NC3000, commercially available from Nippon Kayaku Co., Ltd., softening point: 58 degrees centigrade, epoxy equivalent: 274 g/eq, average n1: 2.5).

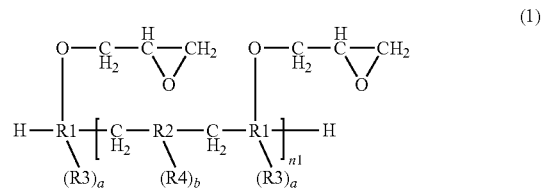

E-3: Epoxy resin represented by the general formula (2) (an epoxy resin as a mixture consisting of 50% by mass of a component in which, in the general formula (2), R6 is a hydrogen atom, c is 0, d is 0 and e is 0, 40% by mass of a component in which R6 is a hydrogen atom, c is 1, d is 0 and e is 0, and 10% by mass of a component in which R6 is a hydrogen atom, c is 1, d is 1 and e is 0, HP4770, commercially available from Direct Interface of China Corporation, softening point: 72 degrees centigrade, epoxy equivalent: 205 g/eq).

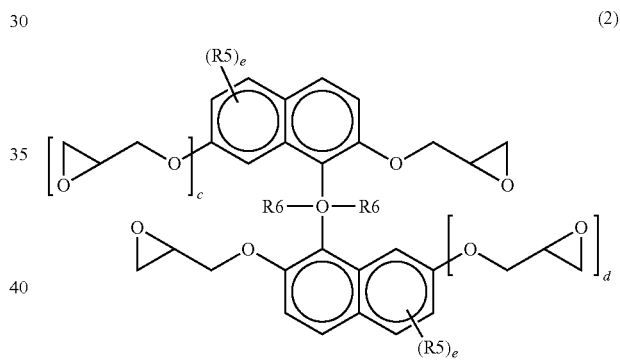

E-4: Epoxy resin represented by the general formula (3) (an epoxy resin in which, in the general formula (3), R7 and R8 are each a hydrogen atom and n3 is 0, YX-8800, commercially available from Mitsubishi Chemical Corporation, melting point: 110 degrees centigrade, epoxy equivalent: 181 g/eq).

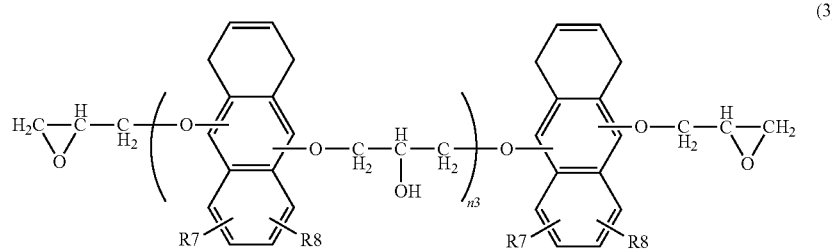

E-5: Epoxy resin represented by the general formula (4) (HP-7200L, commercially available from Direct Interface of China Corporation, softening point: 56 degrees centigrade, epoxy equivalent: 245 q/eq, average n4: 0.4).

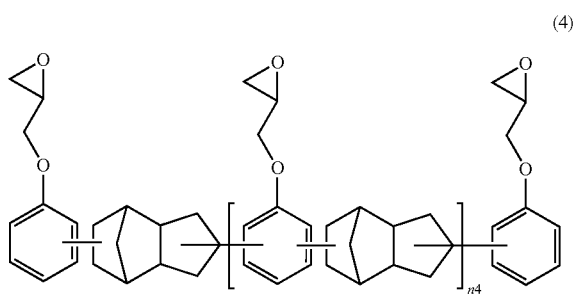

(4)

E-6: Ortho-cresol novolac type epoxy resin (EOCN-1020-55, commercially available from Nippon Kayaku Co., Ltd., softening point: 55 degrees centigrade, epoxy equivalent: 200 g/eq).

Curing Agent

H-1: Phenol novolac resin (PR-HF-3, commercially available from Sumitomo Bakelite Co., Ltd., softening point: 80 degrees centigrade, hydroxyl equivalent: 104 g/eq).

H-2: Phenol aralkyl resin having a biphenylene skeleton (a compound in which, in the general formula (5), —R9- is a phenylene group, —R10- is a biphenylene group, f is 0 and g is 0, MEH-7851SS, commercially available from Meiwa Plastic Industries, Ltd., softening point: 65 degrees centigrade, hydroxyl equivalent: 203 g/eq, average n5: 1.9).

H-3: Naphthol aralkyl resin having a phenylene skeleton (a compound in which, in the general formula (5), —R9- is a naphthylene group, —R10- is a phenylene group, f is 0 and g is 0, SN-485, commercially available from Nippon Steel Chemical Co., Ltd., softening point: 87 degrees centigrade, hydroxyl equivalent: 210 g/eq, average n5: 1.8).

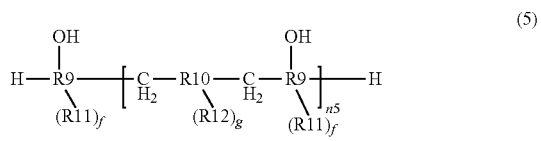

(5)

H-4: Phenol resin represented by the general formula (6) (Kayahard DPN, commercially available from Nippon Kayaku Co., Ltd., softening point: 87 degrees centigrade, hydroxyl equivalent: 165 g/eq, average n6: 0.6).

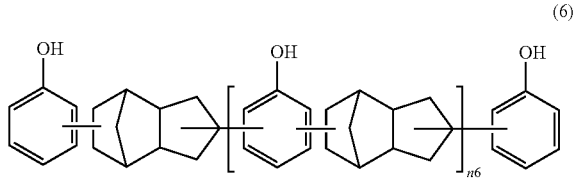

(6)

Spherical Silica

Fused spherical silica 1: HS-202, commercially available from Micron Inc. (mode diameter: 35 μm, specific surface area: 3.5 m$^2$/g, content of coarse particles having a diameter of equal to or more than 55 μm: 0.02% by mass).

Fused spherical silica 2: Obtained by sieving HS-105 commercially available from Micron Inc. using a 300 mesh sieve to remove the coarse particles (mode diameter: 37 μm, specific surface area: 2.5 m$^2$/g, content of coarse particles having a diameter of equal to or more than 55 μm: 0.1% by mass).

Fused spherical silica 3: FB-940, commercially available from Denki Kagaku Kogyo Kabushiki Kaisha (mode diameter: 30 μm, specific surface area: 3.2 m$^2$/g, content of coarse particles having a diameter of equal to or more than 55 μm: 0.2% by mass).

Fused spherical silica 4: HS-203, commercially available from Micron Inc. (mode diameter: 30 μm, specific surface area: 3.7 m$^2$/g, content of coarse particles having a diameter of equal to or more than 55 μm: 0.01% by mass).

Metal Hydroxide and/or Metal Hydroxide Solid Solution, etc.

Metal hydroxide 1: Aluminum hydroxide CL-303, commercially available from Sumitomo Chemical Co., Ltd. (average particle diameter: 3 μm, content of crystallization water: 34% by mass).

Metal hydroxide 2: Aluminum hydroxide CL-308, commercially available from Sumitomo Chemical Co., Ltd. (average particle diameter: 8 μm, content of crystallization water: 34% by mass).

Metal hydroxide 3: Aluminum hydroxide H42M, commercially available from Showa Denko Kabushiki Kaisha (average particle diameter: 1 μm, content of crystallization water: 34% by mass).

Metal hydroxide 4: Aluminum hydroxide BW153, commercially available from Nippon Light Metal Co., Ltd. (average particle diameter: 15 μm, content of crystallization water: 34% by mass).

Metal hydroxide 5: Magnesium hydroxide W-H4, commercially available from Konoshima Chemical Co., Ltd. (average particle diameter: 2 μm, content of crystallization water: 31% by mass).

Metal hydroxide solid solution: Echomag Z-10, commercially available from Tateho Chemical Industries Co., Ltd. (average particle diameter: 1 μm, content of crystallization water: 27% by mass).

Uncalcined clay: Kaobrite 90, commercially available from Shiraishi Calcium Kaisha, Ltd. (average particle diameter: 1 μm, content of crystallization water: 13% by mass).

Talc: Microlite, commercially available from Takehara Kagaku Kogyo Co., Ltd. (average particle diameter: 2.5 μm, content of crystallization water: 5% by mass).

Incidentally, the content of crystallization water in the metal hydroxide and/or metal hydroxide solid solution or the like was shown by the mass loss value when heated from 25 to 650 degrees centigrade at an increase rate of 5 degrees centigrade/min using a TG/DTA analyzer.

Aluminum corrosion inhibitor 1: DHT-4A, commercially available from Kyowa Chemical Corporation, average particle diameter: 0.5 μm, hydrotalcite.

Aluminum corrosion inhibitor 2: IXE-800, commercially available from Toagosei Co., Ltd., average particle diameter: 5 μm, ZrO(OH)$_2$.

Curing Accelerator

Curing accelerator 1: Adduct of triphenylphosphine and 1,4-benzoquinone represented by the general formula (7),

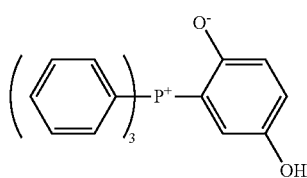

(7)

Coupling Agent
Epoxysilane: γ-glycidoxypropyltrimethoxysilane
Coloring Agent
Carbon black
Mold Release Agent
Carnauba wax Preparation of Epoxy Resin Composition for Encapsulating

|  | Material Example 1 |
| --- | --- |
| E-1 | 1.40 parts by mass |
| E-4 | 3.27 parts by mass |
| H-2 | 5.33 parts by mass |
| Fused spherical silica 1 | 86 parts by mass |
| Metal hydroxide 1 | 3 parts by mass |
| Curing accelerator 1 | 0.3 parts by mass |
| Epoxysilane | 0.25 parts by mass |
| Carbon black | 0.25 parts by mass |
| Carnauba wax | 0.2 parts by mass |

The aforementioned components were mixed at ordinary temperature using a mixer, and then roll-kneaded at 70 to 100 degrees centigrade. After cooling, the resultant was pulverized to obtain an epoxy resin composition for an encapsulating material.

Examples 2 to 34 and Comparative Examples 1 to 4

Epoxy resin compositions were prepared in the same manner as in Example 1 in accordance with formulations of the epoxy resin compositions for an encapsulating material shown in Tables 1 to 5.

Wires used in Examples and Comparative Examples are shown below.

Copper wire: TC-E, commercially available from Tatsuta Electric Wire & Cable Co., Ltd. (copper purity: 99.99% by mass, wire diameter: shown in Tables 1 to 5).

Gold wire: NL-4, commercially available from Sumitomo Metal Mining Co., Ltd. (gold purity: 99.99% by mass, wire diameter: shown in Table 5).

Epoxy resin compositions for an encapsulating material obtained in the respective Examples and Comparative Examples were evaluated in the following manner. The obtained results are shown in Tables 1 to 5.

Evaluation Methods
Spiral Flow

The epoxy resin composition was injected into a mold for the measurement of spiral flow in accordance with EMMI-1-66 under the conditions of a mold temperature of 175 degrees centigrade, an injection pressure of 6.9 MPa, and a pressure application time of 120 seconds using a low-pressure transfer molding machine (KTS-15, commercially available from Kohtaki Precision Machine Co., Ltd.), and the flow length was measured. The unit was cm. If the length is equal to or less than 80 cm, molding defects such as unfilled packages may occur in some cases.

Wire Sweep Ratio

A TEG chip provided with aluminum pads (3.5 mm×3.5 mm, pad pitch: 50 μm) was bonded on a die pad portion of a 352 pin BGA (substrate: bismaleimide triazine resin/glass cloth substrate having a thickness of 0.56 mm, package size: 30×30 mm, thickness: 1.17 mm), and the aluminum pads of the TEG chip and terminals of a substrate were wire-bonded with a wire pitch of 80 μm using the wires. The resultant was encapsulated by the epoxy resin composition and molding was performed under the conditions of a mold temperature of 175 degrees centigrade, an injection pressure of 6.9 MPa, and a curing time of 2 minutes using a low-pressure transfer molding machine (Y Series, commercially available from TOWA Corporation) to produce a 352 pin BGA package. This package was post-cured at 175 degrees centigrade for 4 hours. After cooling to room temperature, the resultant was observed using a soft X-ray fluoroscope (PRO-TEST-100, commercially available from Softex Corporation) and the sweep ratio of the wire was shown as the ratio of (sweep degree)/(wire length). The value for the wire part which exhibited the largest value was recorded. The unit was %. If the value exceeds 5%, it means that adjacent wires are likely to contact with each other.

Cutting Resistance and Tool Wearability

A test piece having a thickness of 3 mm was molded under the conditions of a mold temperature of 175 degrees centigrade, an injection pressure of 6.9 MPa, and a curing time of 180 seconds using a low-pressure transfer molding machine (KTS-30, commercially available from Kohtaki Precision Machine Co., Ltd.). The test piece was subjected to post-curing treatment and heated at 175 degrees centigrade for 8 hours. Then, cutting resistance and tool wearability were evaluated by using a wear test apparatus provided with a drill as a cutting tool. For this test apparatus, a drill having a drill diameter of 3 mm and equivalent sharpness was used, and the number of drill rotations was set to 850 rpm and a load was set to 2 Kg (19.6 N). The test pieces were respectively punched 30 times each and evaluated. However, in order to avoid an error due to a difference in cutting conditions of a blade, the test piece was punched 30 times, and before and after punching, an aluminum plate having a thickness of 3 mm was punched, whereby cutting resistance and tool wearability were evaluated by the values indicated below.

Cutting Resistance: t1/tAl0
Tool Wearability: tAl30/tAl0
t1: time period involved in the first punching of the test piece
tAl0: time period involved in punching of the aluminum plate before punching of the test piece
tAl30: time period involved in punching of the aluminum plate after the 30th punching of the test piece
Incidentally, as the value is smaller, both cutting resistance and tool wearability are excellent.

High Temperature Storage Life (185 Degrees Centigrade)

A TEG (TEST ELEMENT GROUP) chip provided with aluminum electrode pads (3.5 mm×3.5 mm) was bonded on a die pad portion of a 352 pin BGA (substrate: bismaleimide triazine resin/glass cloth substrate having a thickness of 0.56 mm, package size: 30×30 mm, thickness: 1.17 mm), and the aluminum electrode pads of the TEG chip and terminals of a substrate were wire-bonded with a wire pitch of 50 μm using the wires such that the pads and the terminals were daisy-chain connected. The resultant was encapsulated by the epoxy resin composition and molding was performed under the conditions of a mold temperature of 175 degrees centigrade, an injection pressure of 6.9 MPa, and a curing time of 2 minutes using a low-pressure transfer molding machine (Y Series, commercially available from TOWA Corporation) to produce a 352 pin BGA package. The resulting package was post-cured at 175 degrees centigrade for 8 hours, and then a high temperature storage test (185 degrees centigrade) was carried out. The electrical resistance value between the wires was measured every 24 hours. The package exhibiting the increase of the value by 20% compared to the initial value was determined as "defective," and the time period taken to become defective was measured. The defect period was shown by a time period taken to generate at least one defective device in the case of n=5. The unit was hour. When no defects were generated in all of the packages even after 1,000 hour storage, the result was recorded as "1,000<."

High Temperature Storage Life (200 Degrees Centigrade)

A TEG (TEST ELEMENT GROUP) chip provided with aluminum electrode pads (3.5 mm×3.5 mm) was bonded on a die pad portion of a 352 pin BGA (substrate: bismaleimide triazine resin/glass cloth substrate having a thickness of 0.56 mm, package size: 30×30 mm, thickness: 1.17 mm), and the aluminum electrode pads of the TEG chip and terminals of a substrate were wire-bonded with a wire pitch of 50 μm using the wires such that the pads and the terminals were daisy-chain connected. The resultant was encapsulated by the epoxy resin composition and molding was performed under the conditions of a mold temperature of 175 degrees centigrade, an injection pressure of 6.9 MPa, and a curing time of 2 minutes using a low-pressure transfer molding machine (Y Series, commercially available from TOWA Corporation) to produce a 352 pin BGA package. The resulting package was post-cured at 175 degrees centigrade for 8 hours, and then a high temperature storage test (200 degrees centigrade) was carried out. The electrical resistance value between the wires was measured every 24 hours. The package exhibiting the increase of the value by 20% compared to the initial value was determined as "defective," and the time period taken to become defective was measured. The defect period was shown by a time period taken to generate at least one defective device in the case of n=5. The unit was hour.

High Temperature Operating Life

A TEG (TEST ELEMENT GROUP) chip provided with aluminum electrode pads (3.5 mm×3.5 mm) was bonded on a die pad portion of a 352 pin BGA (substrate: bismaleimide triazine resin/glass cloth substrate having a thickness of 0.56 mm, package size: 30×30 mm, thickness: 1.17 mm), and the aluminum electrode pads of the TEG chip and terminals of a substrate were wire-bonded with a wire pitch of 50 μm using the wires such that the pads and the terminals were daisy-chain connected. The resultant was encapsulated by the epoxy resin composition and molding was performed under the conditions of a mold temperature of 175 degrees centigrade, an injection pressure of 6.9 MPa, and a curing time of 2 minutes using a low-pressure transfer molding machine (Y Series, commercially available from TOWA Corporation) to produce a 352 pin BGA package. The resulting package was post-cured at 175 degrees centigrade for 8 hours, and then a DC current of 0.1 A was applied to both ends of the daisy-chain connected portion of this package. While the resultant was stored as it is at high temperature of 185 degrees centigrade, the electrical resistance value between the wires was measured every 12 hours. The package exhibiting the increase of the value by 20% compared to the initial value was determined as "defective," and the time period taken to become defective was measured. The defect period was shown by a time period taken to generate at least one defective device in the case of n=4. The unit was hour.

Moisture Resistance Reliability (130 Degrees Centigrade)

A TEG chip provided with an aluminum circuit (3.5 mm×3.5 mm, exposed aluminum circuit (no protective film)) was bonded on a die pad portion of a 352 pin BGA (substrate: bismaleimide triazine resin/glass cloth substrate having a thickness of 0.56 mm, package size: 30×30 mm, thickness: 1.17 mm), and the aluminum pads and terminals of a substrate were wire-bonded with a wire pitch of 80 μm using the wires. The resultant was encapsulated by the epoxy resin composition and molding was performed under the conditions of a mold temperature of 175 degrees centigrade, an injection pressure of 6.9 MPa, and a curing time of 2 minutes using a low-pressure transfer molding machine (Y Series, commercially available from TOWA Corporation) to produce a 352 pin BGA package. The resulting package was post-cured at 175 degrees centigrade for 8 hours. Then, for this package, the HAST (Highly Accelerated temperature and humidity Stress Test) was conducted in accordance with IEC 68-2-66. Specifically, the package was treated under the conditions of 130 degrees centigrade, 85% RH, 20V application and 168 hours, and the presence or absence of open defect of the circuit was measured. The measurements were made on a total of 20 circuits of 4 terminals/1 package×5 packages and the evaluations were made by the number of defective circuits.

Moisture Resistance Reliability (140 Degrees Centigrade)

A TEG chip provided with an aluminum circuit (3.5 mm×3.5 mm, exposed aluminum circuit (no protective film)) was bonded on a die pad portion of a 352 pin BGA (substrate: bismaleimide triazine resin/glass cloth substrate having a thickness of 0.56 mm, package size: 30×30 mm, thickness: 1.17 mm), and the aluminum pads and terminals of a substrate were wire-bonded with a wire pitch of 80 μm using the wires. The resultant was encapsulated by the epoxy resin composition and molding was performed under the conditions of a mold temperature of 175 degrees centigrade, an injection pressure of 6.9 MPa, and a curing time of 2 minutes using a low-pressure transfer molding machine (Y Series, commercially available from TOWA Corporation) to produce a 352 pin BGA package. The resulting package was post-cured at 175 degrees centigrade for 8 hours. Then, for this package, the HAST (Highly Accelerated temperature and humidity Stress Test) was conducted in accordance with IEC 68-2-66. Specifically, the package was treated under the conditions of 140 degrees centigrade, 85% RH, 20V application and 168 hours, and the presence or absence of open defect of the circuit was measured. The measurements were made on a total of 20 circuits of 4 terminals/1 package×5 packages and the evaluations were made by the number of defective circuits.

Amount of Warpage after Post Mold Curing (PMC)

Encapsulation was carried out by the epoxy resin composition and molding was performed under the conditions of a mold temperature of 175 degrees centigrade, an injection pressure of 6.9 MPa, and a curing time of 2 minutes using a low-pressure transfer molding machine (Y Series, commercially available from TOWA Corporation) to produce a 225 pin BGA package (substrate: BT resin/glass cloth base material having a thickness of 0.36 mm, package size: 24×24 mm, encapsulating resin having a thickness of 1.17 mm, silicon chip size: 9×9 mm, thickness: 0.35 mm, subjected to die bonding). The resulting package was post-cured at 175 degrees centigrade for 8 hours, and then displacement in the diagonal direction was measured from the gate of the package using a surface roughness tester at 25 degrees centigrade. The value exhibiting the highest displacement difference was taken as the amount of warpage after post curing. The unit was μm. An average value of n=3 was shown in Tables.

Variation of Warpage During Processing

After measuring the amount of warpage after the aforementioned post curing, an IR reflow treatment (260 degrees centigrade in accordance with JEDEC conditions) was performed, and then displacement in the diagonal direction was measured from the gate of the package using a surface roughness tester at 25 degrees centigrade. The value exhibiting the highest displacement difference was taken as the amount of warpage during processing. The variation of warpage during processing was determined from the following equation using this value. The unit was μm. An average value of n=3 was shown in Tables.

Variation of warpage during processing=Amount of warpage during processing−Amount of warpage after post curing

TABLE 1

|  |  | Example | | | |
|---|---|---|---|---|---|
|  |  | 1 | 2 | 3 | 4 |
| Formulations of epoxy resin composition for an encapsulating material | E-1 | 1.40 | 1.40 | 1.40 | 1.40 |
|  | E-2 |  |  |  |  |
|  | E-3 |  |  |  |  |
|  | E-4 | 3.27 | 3.27 | 3.27 | 3.27 |
|  | E-5 |  |  |  |  |
|  | E-6 |  |  |  |  |
|  | H-1 |  |  |  |  |
|  | H-2 | 5.33 | 5.33 | 5.33 | 5.33 |
|  | H-3 |  |  |  |  |
|  | H-4 |  |  |  |  |
|  | Fused spherical silica 1 | 86 | 86 | 86 | 86 |
|  | Fused spherical silica 2 |  |  |  |  |
|  | Fused spherical silica 3 |  |  |  |  |
|  | Fused spherical silica 4 |  |  |  |  |
|  | Metal hydroxide 1 | 3 | 2.9 | 2.7 | 2.5 |
|  | Metal hydroxide 2 |  |  |  |  |
|  | Metal hydroxide 3 |  |  |  |  |
|  | Metal hydroxide 4 |  |  |  |  |
|  | Metal hydroxide 5 |  |  |  |  |
|  | Metal hydroxide solid solution |  |  |  |  |
|  | Uncalcined clay |  |  |  |  |
|  | Talc |  |  |  |  |
|  | Aluminum corrosion inhibitor 1 |  | 0.1 | 0.3 | 0.5 |
|  | Aluminum corrosion inhibitor 2 |  |  |  |  |
|  | Curing accelerator 1 | 0.3 | 0.3 | 0.3 | 0.3 |
|  | Epoxysilane | 0.25 | 0.25 | 0.25 | 0.25 |
|  | Carbon black | 0.25 | 0.25 | 0.25 | 0.25 |
|  | Carnauba wax | 0.2 | 0.2 | 0.2 | 0.2 |
| Wire | Kind of wire | Copper | Copper | Copper | Copper |
|  | Copper wire diameter [μm] | 18 | 18 | 18 | 18 |
|  | Gold wire diameter [μm] |  |  |  |  |
| Evaluation results | Spiral flow [cm] | 170 | 175 | 180 | 180 |
|  | Wire sweep ratio [%] | 2.5 | 2.5 | 2.5 | 2.5 |
|  | Cutting resistance ($t_i$/tA10) | 0.16 | 0.16 | 0.15 | 0.15 |
|  | Tool wearability (tA1$^{30}$/tA1) | 1.8 | 1.8 | 1.7 | 1.7 |
|  | High temperature storage life (185° C.) [hr] | 1000< | 1000< | 1000< | 1000< |
|  | High temperature storage life (200° C.) [hr] | 240 | 480 | 840 | 960 |
|  | High temperature operating life [hr] | 500< | 500< | 500< | 500< |
|  | Moisture resistance reliability (130° C.) [Number of defective circuits] | 0 | 0 | 0 | 0 |
|  | Moisture resistance reliability (140° C.) [Number of defective circuits] | 20 | 0 | 0 | 0 |
|  | Amount of warpage after PMC [μm] | 50 | 50 | 51 | 52 |
|  | Variation of warpage during processing [μm] | −18 | −18 | −18 | −19 |

|  |  | Example | | | |
|---|---|---|---|---|---|
|  |  | 5 | 6 | 7 | 8 |
| Formulations of epoxy resin composition for an encapsulating material | E-1 | 1.40 | 1.40 | 1.40 | 1.40 |
|  | E-2 |  |  |  |  |
|  | E-3 |  |  |  |  |
|  | E-4 | 3.27 | 3.27 | 3.27 | 3.27 |
|  | E-5 |  |  |  |  |
|  | E-6 |  |  |  |  |
|  | H-1 |  |  |  |  |
|  | H-2 | 5.33 | 5.33 | 5.33 | 5.33 |
|  | H-3 |  |  |  |  |
|  | H-4 |  |  |  |  |
|  | Fused spherical silica 1 | 86 | 86 | 86 | 86 |
|  | Fused spherical silica 2 |  |  |  |  |
|  | Fused spherical silica 3 |  |  |  |  |

TABLE 1-continued

|   |   |   |   |   |   |
|---|---|---|---|---|---|
|   | Fused spherical silica 4 |   |   |   |   |
|   | Metal hydroxide 1 |   |   |   |   |
|   | Metal hydroxide 2 | 3 |   |   |   |
|   | Metal hydroxide 3 |   | 3 |   |   |
|   | Metal hydroxide 4 |   |   | 3 |   |
|   | Metal hydroxide 5 |   |   |   | 3 |
|   | Metal hydroxide solid solution |   |   |   |   |
|   | Uncalcined clay |   |   |   |   |
|   | Talc |   |   |   |   |
|   | Aluminum corrosion inhibitor 1 |   |   |   |   |
|   | Aluminum corrosion inhibitor 2 |   |   |   |   |
|   | Curing accelerator 1 | 0.3 | 0.3 | 0.3 | 0.3 |
|   | Epoxysilane | 0.25 | 0.25 | 0.25 | 0.25 |
|   | Carbon black | 0.25 | 0.25 | 0.25 | 0.25 |
|   | Carnauba wax | 0.2 | 0.2 | 0.2 | 0.2 |
| Wire | Kind of wire | Copper | Copper | Copper | Copper |
|   | Copper wire diameter [μm] | 18 | 18 | 18 | 18 |
|   | Gold wire diameter [μm] |   |   |   |   |
| Evaluation results | Spiral flow [cm] | 170 | 110 | 140 | 170 |
|   | Wire sweep ratio [%] | 2.5 | 4.0 | 2.8 | 2.9 |
|   | Cutting resistance ($t_1/tA10$) | 0.16 | 0.20 | 0.25 | 0.17 |
|   | Tool wearability ($tA1^{30}/tA1$) | 1.8 | 2.4 | 2.6 | 1.9 |
|   | High temperature storage life (185° C.) [hr] | 1000< | 1000< | 1000< | 1000< |
|   | High temperature storage life (200° C.) [hr] | 240 | 240 | 240 | 240 |
|   | High temperature operating life [hr] | 500< | 500< | 500< | 500< |
|   | Moisture resistance reliability (130° C.) [Number of defective circuits] | 0 | 0 | 0 | 0 |
|   | Moisture resistance reliability (140° C.) [Number of defective circuits] | 20 | 20 | 10 | 20 |
|   | Amount of warpage after PMC [μm] | 50 | 50 | 50 | 50 |
|   | Variation of warpage during processing [μm] | −18 | −20 | −20 | −18 |

TABLE 2

|   |   | Example |   |   |   |
|---|---|---|---|---|---|
|   |   | 9 | 10 | 11 | 12 |
| Formulations of epoxy resin composition for an encapsulating material | E-1 | 1.40 | 1.40 | 1.40 |   |
|   | E-2 |   |   |   | 5.66 |
|   | E-3 |   |   |   |   |
|   | E-4 | 3.27 | 3.27 | 3.27 |   |
|   | E-5 |   |   |   |   |
|   | E-6 |   |   |   |   |
|   | H-1 |   |   |   |   |
|   | H-2 | 5.33 | 5.33 | 5.33 |   |
|   | H-3 |   |   |   | 4.34 |
|   | H-4 |   |   |   |   |
|   | Fused spherical silica 1 | 86 | 86 | 86 | 88.5 |
|   | Fused spherical silica 2 |   |   |   |   |
|   | Fused spherical silica 3 |   |   |   |   |
|   | Fused spherical silica 4 |   |   |   |   |
|   | Metal hydroxide 1 |   |   |   |   |
|   | Metal hydroxide 2 |   |   |   | 0.5 |
|   | Metal hydroxide 3 |   |   |   |   |
|   | Metal hydroxide 4 |   |   |   |   |
|   | Metal hydroxide 5 |   |   |   |   |
|   | Metal hydroxide solid solution | 3 |   |   |   |
|   | Uncalcined clay |   | 3 |   |   |
|   | Talc |   |   | 3 |   |
|   | Aluminum corrosion inhibitor 1 |   |   |   |   |
|   | Aluminum corrosion inhibitor 2 |   |   |   |   |
|   | Curing accelerator 1 | 0.3 | 0.3 | 0.3 | 0.3 |
|   | Epoxysilane | 0.25 | 0.25 | 0.25 | 0.25 |
|   | Carbon black | 0.25 | 0.25 | 0.25 | 0.25 |
|   | Carnauba wax | 0.2 | 0.2 | 0.2 | 0.2 |
| Wire | Kind of wire | Copper | Copper | Copper | Copper |
|   | Copper wire diameter [μm] | 18 | 18 | 18 | 18 |
|   | Gold wire diameter [μm] |   |   |   |   |
| Evaluation results | Spiral flow [cm] | 130 | 120 | 120 | 155 |
|   | Wire sweep ratio [%] | 3.5 | 3.7 | 4.0 | 4.0 |
|   | Cutting resistance ($t_1/tA10$) | 0.20 | 0.20 | 0.25 | 0.25 |
|   | Tool wearability ($tA1^{30}/tA1$) | 2.5 | 2.8 | 2.7 | 2.0 |

TABLE 2-continued

|  |  |  |  |  |  |
|---|---|---|---|---|---|
|  | High temperature storage life (185° C.) [hr] | 1000< | 720 | 672 | 720 |
|  | High temperature storage life (200° C.) [hr] | 240 | 144 | 168 | 168 |
|  | High temperature operating life [hr] | 500< | 336 | 336 | 336 |
|  | Moisture resistance reliability (130° C.) [Number of defective circuits] | 0 | 3 | 4 | 0 |
|  | Moisture resistance reliability (140° C.) [Number of defective circuits] | 20 | 20 | 20 | 20 |
|  | Amount of warpage after PMC [μm] | 55 | 55 | 58 | 43 |
|  | Variation of warpage during processing [μm] | −20 | −20 | −28 | −13 |

|  |  | Example | | | |
|---|---|---|---|---|---|
|  |  | 13 | 14 | 15 | 16 |
| Formulations of epoxy resin composition for an encapsulating material | E-1 |  |  |  |  |
|  | E-2 | 5.66 | 5.66 | 5.66 | 5.66 |
|  | E-3 |  |  |  |  |
|  | E-4 |  |  |  |  |
|  | E-5 |  |  |  |  |
|  | E-6 |  |  |  |  |
|  | H-1 |  |  |  |  |
|  | H-2 |  |  |  |  |
|  | H-3 | 4.34 | 4.34 | 4.34 | 4.34 |
|  | H-4 |  |  |  |  |
|  | Fused spherical silica 1 | 88 | 88 | 88 | 88 |
|  | Fused spherical silica 2 |  |  |  |  |
|  | Fused spherical silica 3 |  |  |  |  |
|  | Fused spherical silica 4 |  |  |  |  |
|  | Metal hydroxide 1 |  |  |  |  |
|  | Metal hydroxide 2 | 1 | 0.9 | 0.7 | 0.5 |
|  | Metal hydroxide 3 |  |  |  |  |
|  | Metal hydroxide 4 |  |  |  |  |
|  | Metal hydroxide 5 |  |  |  |  |
|  | Metal hydroxide solid solution |  |  |  |  |
|  | Uncalcined clay |  |  |  |  |
|  | Talc |  |  |  |  |
|  | Aluminum corrosion inhibitor 1 |  |  |  |  |
|  | Aluminum corrosion inhibitor 2 |  | 0.1 | 0.3 | 0.5 |
|  | Curing accelerator 1 | 0.3 | 0.3 | 0.3 | 0.3 |
|  | Epoxysilane | 0.25 | 0.25 | 0.25 | 0.25 |
|  | Carbon black | 0.25 | 0.25 | 0.25 | 0.25 |
|  | Carnauba wax | 0.2 | 0.2 | 0.2 | 0.2 |
| Wire | Kind of wire | Copper | Copper | Copper | Copper |
|  | Copper wire diameter [μm] | 18 | 18 | 18 | 18 |
|  | Gold wire diameter [μm] |  |  |  |  |
| Evaluation results | Spiral flow [cm] | 150 | 150 | 160 | 165 |
|  | Wire sweep ratio [%] | 4.0 | 4.0 | 3.5 | 3.2 |
|  | Cutting resistance ($t_1/tA10$) | 0.18 | 0.18 | 0.19 | 0.25 |
|  | Tool wearability ($tA1^{30}/tA1$) | 2.0 | 2.0 | 2.0 | 2.0 |
|  | High temperature storage life (185° C.) [hr] | 1000< | 1000< | 1000< | 1000< |
|  | High temperature storage life (200° C.) [hr] | 432 | 840 | 840 | 840 |
|  | High temperature operating life [hr] | 500< | 500< | 500< | 500< |
|  | Moisture resistance reliability (130° C.) [Number of defective circuits] | 0 | 0 | 0 | 0 |
|  | Moisture resistance reliability (140° C.) [Number of defective circuits] | 20 | 5 | 0 | 0 |
|  | Amount of warpage after PMC [μm] | 44 | 44 | 45 | 46 |
|  | Variation of warpage during processing [μm] | −14 | −14 | −16 | −17 |

TABLE 3

|  |  | Example | | | |
|---|---|---|---|---|---|
|  |  | 17 | 18 | 19 | 20 |
| Formulations of epoxy resin composition for an encapsulating material | E-1 |  |  |  | 1.38 |
|  | E-2 |  | 5.66 | 5.66 | 5.66 |
|  | E-3 |  |  |  |  |
|  | E-4 |  |  |  | 3.21 |
|  | E-5 |  |  |  |  |
|  | E-6 |  |  |  |  |

TABLE 3-continued

|  |  |  |  |  |  |
|---|---|---|---|---|---|
|  | H-1 |  |  |  |  |
|  | H-2 |  |  |  |  |
|  | H-3 | 4.34 | 4.34 | 4.34 | 5.41 |
|  | H-4 |  |  |  |  |
|  | Fused spherical silica 1 | 86 | 79 | 77 | 86 |
|  | Fused spherical silica 2 |  |  |  |  |
|  | Fused spherical silica 3 |  |  |  |  |
|  | Fused spherical silica 4 |  |  |  |  |
|  | Metal hydroxide 1 |  |  |  | 3 |
|  | Metal hydroxide 2 | 3 | 10 | 12 |  |
|  | Metal hydroxide 3 |  |  |  |  |
|  | Metal hydroxide 4 |  |  |  |  |
|  | Metal hydroxide 5 |  |  |  |  |
|  | Metal hydroxide solid solution |  |  |  |  |
|  | Uncalcined clay |  |  |  |  |
|  | Talc |  |  |  |  |
|  | Aluminum corrosion inhibitor 1 |  |  |  |  |
|  | Aluminum corrosion inhibitor 2 |  |  |  |  |
|  | Curing accelerator 1 | 0.3 | 0.3 | 0.3 | 0.3 |
|  | Epoxysilane | 0.25 | 0.25 | 0.25 | 0.25 |
|  | Carbon black | 0.25 | 0.25 | 0.25 | 0.25 |
|  | Carnauba wax | 0.2 | 0.2 | 0.2 | 0.2 |
| Wire | Kind of wire | Copper | Copper | Copper | Copper |
|  | Copper wire diameter [μm] | 18 | 18 | 18 | 18 |
|  | Gold wire diameter [μm] |  |  |  |  |
| Evaluation results | Spiral flow [cm] | 140 | 125 | 100 | 150 |
|  | Wire sweep ratio [%] | 4.2 | 4.4 | 4.5 | 2.8 |
|  | Cutting resistance ($t_1$/tA10) | 0.15 | 0.14 | 0.14 | 0.15 |
|  | Tool wearability (tA1$^{30}$/tA1) | 1.8 | 1.7 | 1.6 | 1.8 |
|  | High temperature storage life (185° C.) [hr] | 1000< | 1000< | 1000< | 1000< |
|  | High temperature storage life (200° C.) [hr] | 216 | 240 | 288 | 240 |
|  | High temperature operating life [hr] | 500< | 500< | 500< | 500< |
|  | Moisture resistance reliability (130° C.) [Number of defecive circuits] | 0 | 0 | 0 | 0 |
|  | Moisture resistance reliability (140° C.) [Number of defective circuits] | 20 | 8 | 7 | 20 |
|  | Amount of warpage after PMC [μm] | 50 | 63 | 65 | 40 |
|  | Variation of warpage during processing [μm] | −16 | −25 | −30 | −10 |

|  |  | Example | | | |
|---|---|---|---|---|---|
|  |  | 21 | 22 | 23 | 24 |
| Formulations of epoxy resin composition for an encapsulating material | E-1 | 1.56 | 1.75 |  | 1.46 |
|  | E-2 |  |  | 1.50 |  |
|  | E-3 |  |  |  | 3.42 |
|  | E-4 | 3.64 | 4.07 | 3.49 |  |
|  | E-5 |  |  |  |  |
|  | E-6 |  |  |  |  |
|  | H-1 |  | 2.09 |  |  |
|  | H-2 |  |  | 5.01 | 5.12 |
|  | H-3 |  |  |  |  |
|  | H-4 | 4.80 | 2.09 |  |  |
|  | Fused spherical silica 1 | 86 | 86 | 86 | 86 |
|  | Fused spherical silica 2 |  |  |  |  |
|  | Fused spherical silica 3 |  |  |  |  |
|  | Fused spherical silica 4 |  |  |  |  |
|  | Metal hydroxide 1 | 3 | 3 | 3 | 3 |
|  | Metal hydroxide 2 |  |  |  |  |
|  | Metal hydroxide 3 |  |  |  |  |
|  | Metal hydroxide 4 |  |  |  |  |
|  | Metal hydroxide 5 |  |  |  |  |
|  | Metal hydroxide solid solution |  |  |  |  |
|  | Uncalcined clay |  |  |  |  |
|  | Talc |  |  |  |  |
|  | Aluminum corrosion inhibitor 1 |  |  |  |  |
|  | Aluminum corrosion inhibitor 2 |  |  |  |  |
|  | Curing accelerator 1 | 0.3 | 0.3 | 0.3 | 0.3 |
|  | Epoxysilane | 0.25 | 0.25 | 0.25 | 0.25 |
|  | Carbon black | 0.25 | 0.25 | 0.25 | 0.25 |
|  | Carnauba wax | 0.2 | 0.2 | 0.2 | 0.2 |
| Wire | Kind of wire | Copper | Copper | Copper | Copper |
|  | Copper wire diameter [μm] | 18 | 18 | 18 | 18 |
|  | Gold wire diameter [μm] |  |  |  |  |
| Evaluation results | Spiral flow [cm] | 180 | 165 | 145 | 160 |
|  | Wire sweep ratio [%] | 2.1 | 2.5 | 2.9 | 2.6 |
|  | Cutting resistance ($t_1$/tA10) | 0.15 | 0.16 | 0.15 | 0.17 |

TABLE 3-continued

|  | | | | |
|---|---|---|---|---|
| Tool wearability (tAl³⁰/tA1) | 1.8 | 1.9 | 1.8 | 2.0 |
| High temperature storage life (185° C.) [hr] | 1000< | 1000< | 1000< | 1000< |
| High temperature storage life (200° C.) [hr] | 240 | 240 | 240 | 264 |
| High temperature operating life [hr] | 500< | 500< | 500< | 500< |
| Moisture resistance reliability (130° C.) [Number of defective circuits] | 0 | 1 | 0 | 0 |
| Moisture resistance reliability (140° C.) [Number of defective circuits] | 20 | 20 | 20 | 20 |
| Amount of warpage after PMC [μm] | 45 | 56 | 55 | 43 |
| Variation of warpage during processing [μm] | −14 | −20 | −25 | −12 |

TABLE 4

|  |  | Example | | | |
|---|---|---|---|---|---|
|  |  | 25 | 26 | 27 | 28 |
| Formulations of epoxy resin composition for an encapsulating material | E-1 | | | | |
|  | E-2 | | | | |
|  | E-3 | 5.02 | 5.02 | | |
|  | E-4 | | | | |
|  | E-5 | | | 5.47 | 5.47 |
|  | E-6 | | | | |
|  | H-1 | | | | |
|  | H-2 | 4.98 | 4.98 | 4.53 | 4.53 |
|  | H-3 | | | | |
|  | H-4 | | | | |
|  | Fused spherical silica 1 | 86 | | | |
|  | Fused spherical silica 2 | | | | |
|  | Fused spherical silica 3 | | | | |
|  | Fused spherical silica 4 | | 86 | 86 | 86 |
|  | Metal hydroxide 1 | 3 | 3 | 3 | |
|  | Metal hydroxide 2 | | | | |
|  | Metal hydroxide 3 | | | | |
|  | Metal hydroxide 4 | | | | |
|  | Metal hydroxide 5 | | | | |
|  | Metal hydroxide solid solution | | | | 3 |
|  | Uncalcined clay | | | | |
|  | Talc | | | | |
|  | Aluminum corrosion inhibitor 1 | | | | |
|  | Aluminum corrosion inhibitor 2 | | | | |
|  | Curing accelerator 1 | 0.3 | 0.3 | 0.3 | 0.3 |
|  | Epoxysilane | 0.25 | 0.25 | 0.25 | 0.25 |
|  | Carbon black | 0.25 | 0.25 | 0.25 | 0.25 |
|  | Carnauba wax | 0.2 | 0.2 | 0.2 | 0.2 |
| Wire | Kind of wire | Copper | Copper | Copper | Copper |
|  | Copper wire diameter [μm] | 18 | 18 | 18 | 18 |
|  | Gold wire diameter [μm] | | | | |
| Evaluation results | Spiral flow [cm] | 160 | 175 | 190 | 165 |
|  | Wire sweep ratio [%] | 3.0 | 2.7 | 2.2 | 2.5 |
|  | Cutting resistance (t₁/tA10) | 0.16 | 0.16 | 0.16 | 0.20 |
|  | Tool wearability (tAl³⁰/tA1) | 1.8 | 1.8 | 1.8 | 2.5 |
|  | High temperature storage life (185° C.) [hr] | 1000< | 1000< | 1000< | 1000< |
|  | High temperature storage life (200° C.) [hr] | 264 | 264 | 168 | 168 |
|  | High temperature operating life [hr] | 500< | 500< | 500< | 500< |
|  | Moisture resistance reliability (130° C.) [Number of defective circuits] | 0 | 0 | 0 | 0 |
|  | Moisture resistance reliability (140° C.) [Number of defective circuits] | 20 | 20 | 20 | 20 |
|  | Amount of warpage after PMC [μm] | 45 | 43 | 55 | 55 |
|  | Variation of warpage during processing [μm] | −15 | −15 | −20 | −20 |

|  |  | Example | | | |
|---|---|---|---|---|---|
|  |  | 29 | 30 | 31 | 32 |
| Formulations of epoxy resin composition for an encapsulating | E-1 | | | 1.89 | 1.89 |
|  | E-2 | | | | |
|  | E-3 | | | | |
|  | E-4 | | | 4.42 | 4.42 |

TABLE 4-continued

| material | | | | | |
|---|---|---|---|---|---|
| | E-5 | 5.47 | 7.02 | | |
| | E-6 | | | | |
| | H-1 | | 2.98 | 3.69 | 3.69 |
| | H-2 | 4.53 | | | |
| | H-3 | | | | |
| | H-4 | | | | |
| | Fused spherical silica 1 | | | | |
| | Fused spherical silica 2 | | | 86 | |
| | Fused spherical silica 3 | | | | 86 |
| | Fused spherical silica 4 | 86 | 86 | | |
| | Metal hydroxide 1 | | 3 | 3 | 3 |
| | Metal hydroxide 2 | | | | |
| | Metal hydroxide 3 | | | | |
| | Metal hydroxide 4 | | | | |
| | Metal hydroxide 5 | | | | |
| | Metal hydroxide solid solution | | | | |
| | Uncalcined clay | 3 | | | |
| | Talc | | | | |
| | Aluminum corrosion inhibitor 1 | | | | |
| | Aluminum corrosion inhibitor 2 | | | | |
| | Curing accelerator 1 | 0.3 | 0.3 | 0.3 | 0.3 |
| | Epoxysilane | 0.25 | 0.25 | 0.25 | 0.25 |
| | Carbon black | 0.25 | 0.25 | 0.25 | 0.25 |
| | Carnauba wax | 0.2 | 0.2 | 0.2 | 0.2 |
| Wire | Kind of wire | Copper | Copper | Copper | Copper |
| | Copper wire diameter [μm] | 18 | 18 | 18 | 18 |
| | Gold wire diameter [μm] | | | | |
| Evaluation results | Spiral flow [cm] | 150 | 140 | 180 | 170 |
| | Wire sweep ratio [%] | 3.0 | 4.1 | 3.4 | 3.7 |
| | Cutting resistance ($t_1/tA10$) | 0.20 | 0.16 | 0.15 | 0.15 |
| | Tool wearability ($tA1^{30}/tA1$) | 2.8 | 1.8 | 1.8 | 1.8 |
| | High temperature storage life (185° C.) [hr] | 720 | 1000< | 1000< | 1000< |
| | High temperature storage life (200° C.) [hr] | 168 | 240 | 240 | 240 |
| | High temperature operating life [hr] | 500< | 500< | 500< | 500< |
| | Moisture resistance reliability (130° C.) [Number of defective circuits] | 0 | 0 | 0 | 0 |
| | Moisture resistance reliability (140° C.) [Number of defective circuits] | 20 | 20 | 20 | 20 |
| | Amount of warpage after PMC [μm] | 58 | 50 | 50 | 52 |
| | Variation of warpage during processing [μm] | −18 | −18 | −18 | −19 |

TABLE 5

| | | Example | | Comparative Example | | | |
|---|---|---|---|---|---|---|---|
| | | 33 | 34 | 1 | 2 | 3 | 4 |
| Formulations of epoxy resin composition for an encapsulating material | E-1 | 1.89 | 1.89 | 1.89 | 1.89 | 1.89 | 1.89 |
| | E-2 | | | | | | |
| | E-3 | | | | | | |
| | E-4 | 4.42 | 4.42 | 4.42 | 4.42 | 4.42 | 4.42 |
| | E-5 | | | | | | |
| | E-6 | | | | | | |
| | H-1 | 3.69 | 3.69 | 3.69 | 3.69 | 3.69 | 3.69 |
| | H-2 | | | | | | |
| | H-3 | | | | | | |
| | H-4 | | | | | | |
| | Fused spherical silica 1 | 86 | 86 | 86 | 86 | 86 | 89 |
| | Fused spherical silica 2 | | | | | | |
| | Fused spherical silica 3 | | | | | | |
| | Fused spherical silica 4 | | | | | | |
| | Metal hydroxide 1 | 3 | 3 | 3 | 3 | 3 | |
| | Metal hydroxide 2 | | | | | | |
| | Metal hydroxide 3 | | | | | | |
| | Metal hydroxide 4 | | | | | | |
| | Metal hydroxide 5 | | | | | | |
| | Metal hydroxide solid solution | | | | | | |
| | Uncalcined clay | | | | | | |
| | Talc | | | | | | |
| | Aluminum corrosion inhibitor 1 | | | | | | |
| | Aluminum corrosion inhibitor 2 | | | | | | |

TABLE 5-continued

|  |  | Example | | Comparative Example | | | |
|---|---|---|---|---|---|---|---|
|  |  | 33 | 34 | 1 | 2 | 3 | 4 |
|  | Curing accelerator 1 | 0.3 | 0.3 | 0.3 | 0.3 | 0.3 | 0.3 |
|  | Epoxysilane | 0.25 | 0.25 | 0.25 | 0.25 | 0.25 | 0.25 |
|  | Carbon black | 0.25 | 0.25 | 0.25 | 0.25 | 0.25 | 0.25 |
|  | Carnauba wax | 0.2 | 0.2 | 0.2 | 0.2 | 0.2 | 0.2 |
| Wire | Kind of wire | Copper | Copper | Gold | Copper | Copper | Copper |
|  | Copper wire diameter [μm] | 18 | 23 |  | 16 | 25 | 18 |
|  | Gold wire diameter [μm] |  |  | 18 |  |  |  |
| Evaluation results | Spiral flow [cm] | 170 | 170 | 170 | 170 | 170 | 180 |
|  | Wire sweep ratio [%] | 3.0 | 2.6 | 5< | 5< | Unable to perform wire bonding by ball portion contact | 2.2 |
|  | Cutting resistance ($t_1$/tA10) | 0.15 | 0.15 | 0.15 | 0.15 |  | 0.40 |
|  | Tool wearability ($tAl^{30}$/tA1) | 1.8 | 1.8 | 1.8 | 1.8 |  | 3.5 |
|  | High temperature storage life (185° C.) [hr] | 1000< | 1000< | 1000< | 264 |  | 1000< |
|  | High temperature storage life (200° C.) [hr] | 240 | 336 | 360 | 72 |  | 240 |
|  | High temperature operating life [hr] | 500< | 500< | 500< | 96 |  | 168 |
|  | Moisture resistance reliability (130° C.) [Number of defective circuits] | 0 | 0 | 0 | 6 |  | 10 |
|  | Moisture resistance reliability (140° C.) [Number of defective circuits] | 20 | 20 | 5 | 20 |  | 20 |
|  | Amount of warpage after PMC [μm] | 50 | 50 | 50 | 50 |  | 40 |
|  | Variation of warpage during processing [μm] | −17 | −17 | −17 | −17 |  | −15 |

As apparent from the results shown in Tables 1 to 5, Examples 1 to 34 were excellent in the wire sweep ratio, high temperature storage life, high temperature operating life and moisture resistance reliability.

In particular, the epoxy resin compositions containing aluminum hydroxide as the metal hydroxide and/or metal hydroxide solid solution (D) along with the epoxy resin (A), the curing agent (B) and the spherical silica (C), and further containing zirconium hydroxide and hydrotalcite as the aluminum corrosion inhibitor were used in Examples 2 to 4 and Examples 14 to 16, exhibiting properties excellent in high temperature storage life at 200 degrees centigrade and the moisture resistance reliability at 140 degrees centigrade, along with other properties shown in Tables.

The semiconductor device obtained according to the present invention can be suitably used for a semiconductor device consisting of a lead frame having a die pad portion or a circuit board, at least one semiconductor element which is stacked on or mounted in parallel on the die pad portion of the lead frame or on the circuit board, a copper wire which electrically connects an electrical bonding portion provided on the die pad portion of the lead frame or the circuit board to an electrode pad provided on the semiconductor element, and an encapsulating material which encapsulates the semiconductor element and the copper wire, particularly a MAP type semiconductor device obtained by encapsulating with the epoxy resin composition for an encapsulating material and molding at one time, and then segmenting the molded product into pieces.

The invention claimed is:

1. A semiconductor device comprising a lead frame having a die pad portion or a circuit board provided with an electrical bonding portion,
a plurality of semiconductor elements being stacked on or mounted in parallel on said die pad portion of said lead frame or on said circuit board, each semiconductor element having an electrode pad,
a copper wire which electrically connects said electrical bonding portion provided on said lead frame or said circuit board to said electrode pad provided on said semiconductor elements, and
an encapsulating material which encapsulates said semiconductor elements and said copper wire,
wherein the wire diameter of said copper wire is equal to or more than 18 μm and equal to or less than 23 μm,
one end of said copper wire is bonded to said electrical bonding portion provided on said lead frame or said circuit board, the other end of said copper wire is bonded to said electrode pad provided on said semiconductor element,
said copper wire consists of copper of which the purity is equal to or more than 99.99% by mass,
said encapsulating material is composed of a cured product of an epoxy resin composition,
said epoxy resin composition contains an epoxy resin (A), a curing agent (B), a spherical silica (C), and a metal hydroxide and/or metal hydroxide solid solution (D) wherein said metal hydroxide and/or metal hydroxide solid solution (D) is aluminum hydroxide and/or magnesium hydroxide,
wherein said metal hydroxide and/or metal hydroxide solid solution (D) has an average particle diameter equal to or more than 2 μm and equal to or less than 10 μm, and
wherein said encapsulating material has a tool wearability, measured by the following measurement steps (1) to (4) and defined as the following tAl30/tA10 is equal to or less than 2.0:

(1) molding said encapsulating material having a thickness of 3 mm under the conditions of a mold temperature of 175° C., an injection pressure of 6.9 MPa, a curing time of 180 seconds using a low-pressure transfer molding machine;

(2) subjecting the encapsulating material to post-curing treatment at 175° C. for 8 hours;

(3) evaluating the tool wearability by using a wear test apparatus provided with a drill as a cutting tool; and (4) punching the encapsulating material 30 times, and before and after punching, an aluminum plate having a thickness of 3 mm is punched, wherein the tAl10 is a time period involved in punching of the aluminum plate before punching of the encapsulating material, wherein the tAl30 is a time period involved in punching of the aluminum plate after the 30th punching of the encapsulating material, wherein said epoxy resin composition further contains one or more of aluminum corrosion inhibitors selected from the group consisting of zirconium hydroxide, hydrotalcite and boehmite, and wherein the semiconductor device has a High Temperature Storage Life (200° C.) of said epoxy resin composition, measured the following measurement steps (1) to (4) and defined as the following defect period is equal to or more than 480 hours:

(1) providing a TEG (TEST ELEMENT GROUP) chip with aluminum electrode pads (3.5 mm×3.5 mm) is bonded on a die pad portion of a 352 pin BGA (substrate: bismaleimide triazine resin/glass cloth substrate having a thickness of 0.56 mm, package size: 30×30 mm, thickness: 1.17 mm), and the aluminum electrode pads of the TEG chip and terminals of a substrate are wire-bonded with a wire pitch of 50 μm using the wires such that the pads and the terminals are daisy-chain connected;

(2) encapsulating the resultant by said epoxy resin composition and molding is performed under the conditions of a mold temperature of 175° C., an injection pressure of 6.9 MPa, and a curing time of 2 minutes using a low-pressure transfer molding machine to produce a 352 pin BGA package;

(3) curing the resulting 352 BGA package at 175° C. for 8 hours and then carrying out a high temperature storage test (200 degrees centigrade); and (4) measuring the electrical resistance value between the wires every 24 hours, the package exhibiting an increase of a value by 20% compared to an initial value is determined as defective, and measuring a time period taken to become defective, wherein the defect period is shown by a time period in hours taken to generate at least one defective device out of five devices.

2. The semiconductor device according to claim 1, wherein the content ratio of said metal hydroxide and/or metal hydroxide solid solution (D) is equal to or more than 1% by mass and equal to or less than 10% by mass, based on the total mass of said epoxy resin composition.

3. The semiconductor device according to claim 1, wherein said metal hydroxide and/or metal hydroxide solid solution (D) contains crystallization water in an amount of equal to or more than 20% by mass.

4. The semiconductor device according to claim 1, wherein the mode diameter of said spherical silica (C) is equal to or less than 35 μm, and the content ratio of particles having a diameter of equal to or more than 55 μm contained in said spherical silica (C) is equal to or less than 0.1% by mass.

5. The semiconductor device according to claim 1, wherein said epoxy resin contains at least one epoxy resin selected from the group consisting of an epoxy resin represented by the general formula (1), an epoxy resin represented by the general formula (2), an epoxy resin represented by the general formula (3) and an epoxy resin represented by the general formula (4),

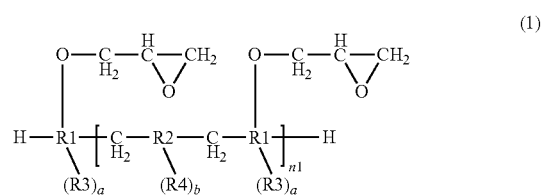

wherein, in the general formula (1), —R1- is a phenylene group or a naphthylene group; the bonding position of the glycidyl ether groups may be any one of α-position and β-position when —R1- is a naphthylene group; —R2- is a phenylene group, a biphenylene group or a naphthylene group; R3 and R4 are groups introduced to R1 and R2 respectively, are each a hydrocarbon group having 1 to 10 carbon atoms, and may be the same or different from each other; a is an integer of from 0 to 5; b is an integer of from 0 to 8; and an average value of n1 is a positive number of equal to or more than 1 and equal to or less than 3,

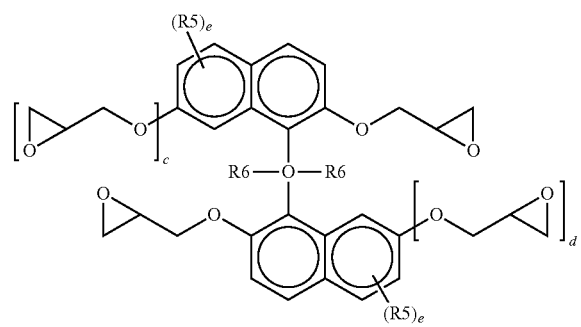

wherein, in the general formula (2), R5 is a hydrocarbon group having 1 to 4 carbon atoms, and may be the same or different from each other; R6 is a hydrogen atom or a hydrocarbon group having 1 to 4 carbon atoms, and may be the same or different from each other; c and d are each an integer of 0 or 1; and e is an integer of from 0 to 5,

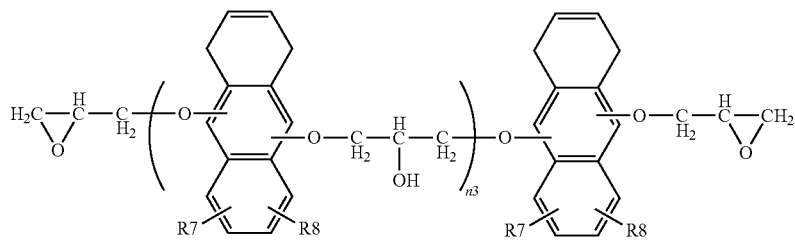

(3)

wherein, in the general formula (3), R7 and R8 are each a hydrogen atom or a methyl group; and n3 is an integer of from 0 to 5,

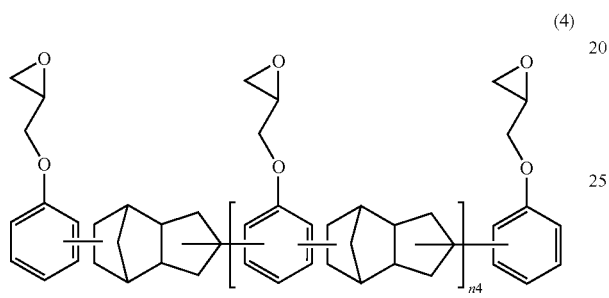

(4)

wherein, in the general formula (4), an average value of n4 is a positive number of equal to or more than 0 and equal to or less than 4.

6. The semiconductor device according to claim 1, wherein said curing agent contains a phenol resin represented by the general formula (5),

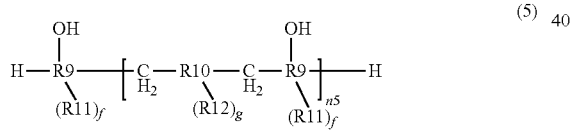

(5)

wherein, in the general formula (5), —R9- is a phenylene group or a naphthylene group; the binding position of the hydroxyl groups may be any one of α-position and β-position when —R9- is a naphthylene group; —R10- is a phenylene group, a biphenylene group or a naphthylene group; R11 and R12 are groups introduced to R9 and R10 respectively, are each a hydrocarbon group having 1 to 10 carbon atoms, and may be the same or different from each other; f is an integer of from 0 to 5; g is an integer of from 0 to 8; and an average value of n5 is a positive number of equal to or more than 1 and equal to or less than 3.

7. The semiconductor device according to claim 1, wherein said curing agent contains a phenol resin represented by the general formula (6),

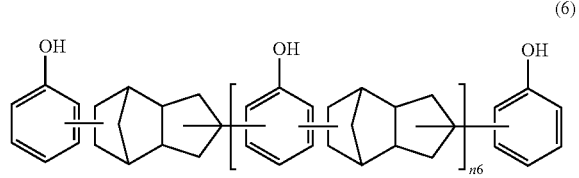

(6)

wherein, in the general formula (6), an average value of n6 is a positive number of equal to or more than 0 and equal to or less than 4.

8. The semiconductor device according to claim 1, wherein said metal hydroxide and/or metal hydroxide solid solution (D) exhibits a basic property.

\* \* \* \* \*